(12) United States Patent
Hwang

(10) Patent No.: US 11,468,956 B2
(45) Date of Patent: Oct. 11, 2022

(54) MEMORY DEVICE AND METHOD OF OPERATING THE SAME

(71) Applicant: SK hynix Inc., Icheon-si Gyeonggi-do (KR)

(72) Inventor: Sung Hyun Hwang, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/953,755

(22) Filed: Nov. 20, 2020

(65) Prior Publication Data

US 2022/0020441 A1 Jan. 20, 2022

(30) Foreign Application Priority Data

Jul. 15, 2020 (KR) .................. 10-2020-0087830

(51) Int. Cl.
*G11C 16/04* (2006.01)
*G11C 16/34* (2006.01)
*G11C 11/56* (2006.01)
*G11C 16/10* (2006.01)

(52) U.S. Cl.
CPC ...... *G11C 16/3459* (2013.01); *G11C 11/5628* (2013.01); *G11C 11/5671* (2013.01); *G11C 16/0483* (2013.01); *G11C 16/10* (2013.01)

(58) Field of Classification Search
CPC ............ G11C 16/3459; G11C 11/5671; G11C 16/0483; G11C 16/10
See application file for complete search history.

(56) References Cited

U.S. PATENT DOCUMENTS

| 2012/0081957 A1* | 4/2012 | Kim | ............... G11C 16/3436 365/185.2 |
| 2012/0170373 A1* | 7/2012 | Kim | ............... G11C 16/10 365/185.19 |
| 2015/0348633 A1* | 12/2015 | Song | ............... G11C 11/5642 365/185.19 |

FOREIGN PATENT DOCUMENTS

| KR | 1020100056860 A | 5/2010 |
| KR | 1020120077283 A | 7/2012 |

* cited by examiner

*Primary Examiner* — Uyen Smet
(74) *Attorney, Agent, or Firm* — William Park & Associates Ltd.

(57) ABSTRACT

The present disclosure relates to a memory device that includes a plurality of memory cells. The memory device also includes a peripheral circuit configured to perform a program operation of storing data in the plurality of memory cells, which includes a plurality of program loops each including an operation of applying a program voltage to a selected word line commonly connected to the plurality of memory cells and a verify operation of applying at least one verify voltage among verify voltages respectively corresponding to target program states of the plurality of memory cells. The memory device additionally includes control logic configured to control the peripheral circuit so that the at least one verify voltage increases according to a program loop of the plurality of program loops during the program operation.

18 Claims, 16 Drawing Sheets

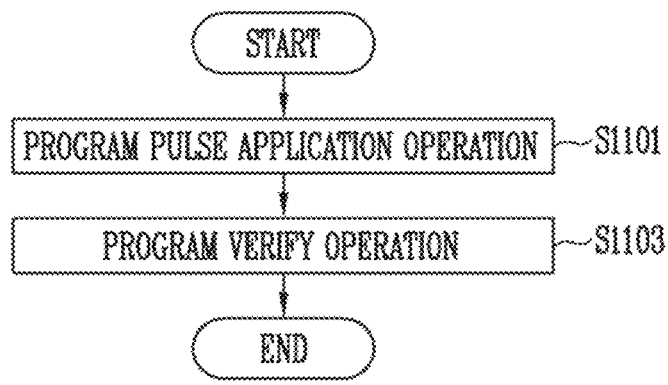
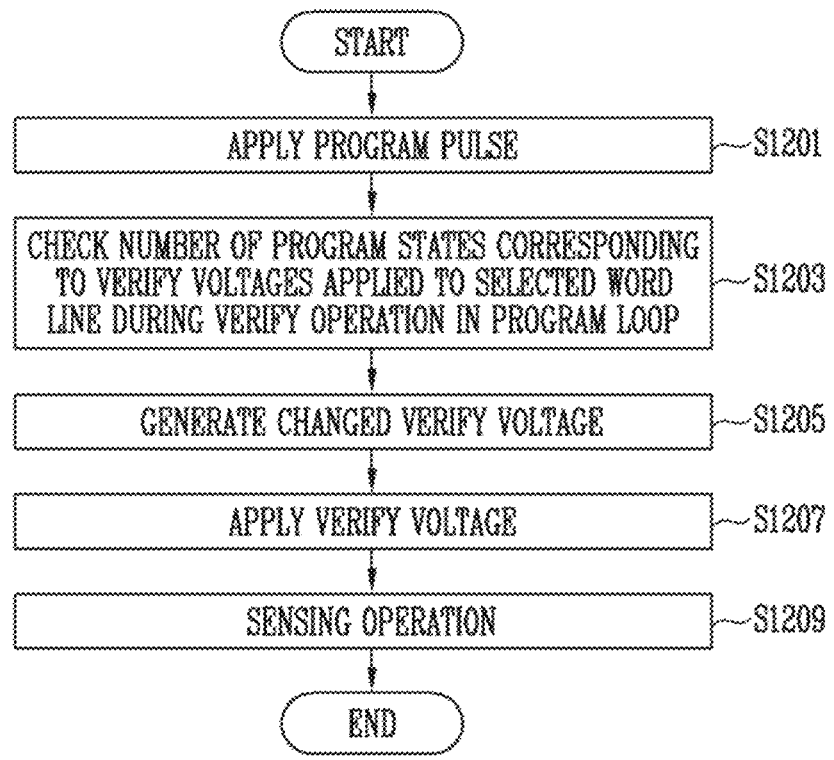

| count | Offset |
|---|---|
| 1 | 10 |
| 2 | 15 |
| 3 | 20 |
| 4 | 30 |
| 5 | 40 |
| 6 | 60 |

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0087830, filed on Jul. 15, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under the control of a host device, such as a computer or a smartphone. A storage device may include a memory device in which data is stored and a memory controller controlling the memory device. The memory device may be a volatile memory device or a non-volatile memory device.

A volatile memory device is a memory device that stores data when power is supplied and loses the stored data when the power supply is cut off. Volatile memory devices may include static random access memory (SRAM), dynamic random access memory (DRAM), and the like.

A non-volatile memory device is a memory device that does not lose data when power is cut off. Non-volatile memory devices may include read only memory (ROM), programmable ROM (PROM), electrically programmable ROM (EPROM), electrically erasable and programmable ROM (EEPROM), flash memory, and the like.

SUMMARY

An embodiment of the present disclosure is directed to a memory device having high reliability by improving a threshold voltage distribution and a method of operating the memory device.

A memory device according to an embodiment of the present disclosure may include: a plurality of memory cells; a peripheral circuit configured to perform a program operation of storing data in the plurality of memory cells, which includes a plurality of program loops each including an operation of applying a program voltage to a selected word line commonly connected to the plurality of memory cells and a verify operation of applying at least one verify voltage among verify voltages respectively corresponding to target program states of the plurality of memory cells; and control logic configured to control the peripheral circuit so that the at least one verify voltage increases according to a program loop of the plurality of program loops during the program operation.

A memory device according to an embodiment of the present disclosure may include: a memory cell array including a plurality of memory cells connected to a plurality of word lines; a peripheral circuit configured to perform a program operation including a plurality of program loops each program loop including an operation of applying a program voltage to a selected word line among the plurality of word lines and a verify operation of applying some verify voltages among verify voltages respectively corresponding to target program states of the plurality of memory cells; and control logic configured to control the peripheral circuit to determine a voltage level of the some verify voltages based on the number of target program states corresponding to the some verify voltages and perform the program operation using the determined some verify voltages.

A method of operating a memory device that performs a program operation of storing data in a plurality of memory cells is provided, the program operation including a plurality of program loops each including a program voltage application operation and a verify operation, the method including: applying a program voltage to a word line commonly connected to the plurality of memory cells; and applying, in the verify operation, verify voltages respectively increased by step voltages over verify voltages applied in a verify operation of a previous program loop. The step voltages may be determined based on the number of target program states corresponding to verify voltages to be applied to the word line and voltage levels of the verify voltages applied in the verify operation of the previous program loop.

A memory device according to an embodiment of the present disclosure may include: a plurality of memory cells; a peripheral circuit configured to perform a program operation of storing data in the plurality of memory cells, which includes a plurality of program loops each including an operation of applying a program voltage to a selected word line commonly connected to the plurality of memory cells and a verify operation of applying at least one verify voltage among verify voltages respectively corresponding to target program states of the plurality of memory cells; and control logic configured to control the peripheral circuit so that some of at least two verify voltages applied to the selected word line have a negative voltage level and some have a positive voltage level during the verify operation.

BRIEF DESCRIPTION OF THE DRAWINGS

FIG. 11 is a flowchart illustrating a program voltage application operation and a verify operation included in the program loop of the memory device of FIG. 1 according to an embodiment.

FIG. 12 is a flowchart illustrating the program voltage application operation and the verify operation using a changed verify voltage, which are included in the program loop of the memory device of FIG. 2, according to an embodiment.

DETAILED DESCRIPTION

The advantages and features of the present disclosure, and a method of accomplishing the advantages and features, will be described through embodiments that are described in detail below together with the accompanying drawings. However, the present disclosure is not limited to the embodiments described herein and may be embodied in other forms. The present embodiments are provided to describe the technical spirit of the present disclosure in detail to those skilled in the art to which the present disclosure pertains so that those skilled in the art may implement the technical spirit of the present disclosure.

Figure 1:
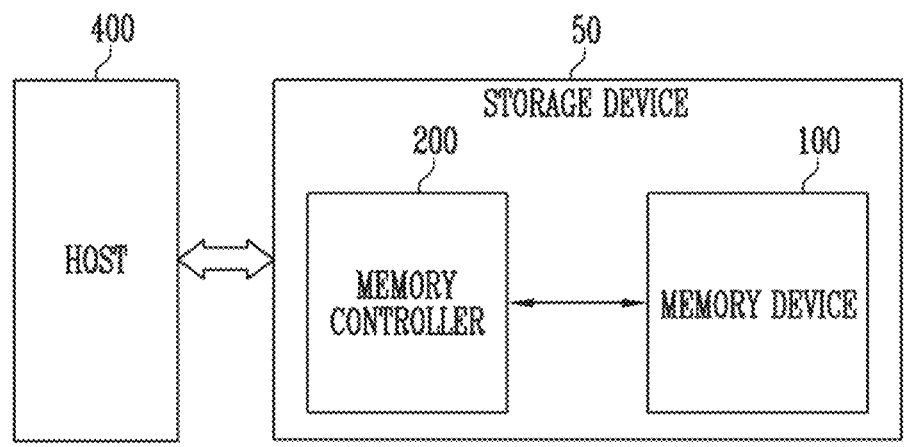
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls operation of the memory device. The storage device 50 is a device that stores data under the control of a host 400 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with a host 400. For example, the storage device 50 may be configured as any one of various types of storage devices, such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under the control of the memory controller 200. The memory device 100 may include a memory cell array including a plurality of memory cells that store the data.

Each of the memory cells may be configured as a single-level cell (SLC) storing one data bit, a multi-level cell (MLC) storing two data bits, a triple-level cell (TLC) storing three data bits, or a quad-level cell (QLC) storing four data bits.

The memory cell array may include a plurality of memory blocks. Each memory block may include a plurality of memory cells. One memory block may include a plurality of pages. In an embodiment, a page may be a unit for storing data in the memory device 100 or reading data stored in the memory device 100.

A memory block may be a unit for erasing data. In an embodiment, the memory device 100 may include double data rate synchronous dynamic random access memory (DDR SDRAM), low power double data rate4 (LPDDR4) SDRAM, graphics double data rate (GDDR) SDRAM, low power DDR (LPDDR), Rambus dynamic random access memory (RDRAM), NAND flash memory, vertical NAND flash memory, NOR flash memory, resistive random access memory (RRAM), phase-change random access memory (PRAM), magnetoresistive random access memory (MRAM), ferroelectric random access memory (FRAM), spin transfer torque random access memory (STT-RAM), or the like. In the present specification, for convenience of description, it is assumed that the memory device 100 is a NAND flash memory device.

The memory device 100 is configured to receive a command and an address from the memory controller 200 and access a region selected by the address of the memory cell array. That is, the memory device 100 may perform an operation instructed by a command on the region selected by the address. For example, the memory device 100 may perform a write operation (program operation), a read operation, and an erase operation. During the program operation, the memory device 100 may program data to the region selected by the address. During the read operation, the memory device 100 may read data from the region selected by the address. During the erase operation, the memory device 100 may erase data stored in the region selected by the address.

The memory controller 200 controls overall operation of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host 400 and the memory device 100.

In an embodiment, the memory controller 200 may receive data and a logical block address (LBA) from the host 400 and convert the LBA into a physical block address (PBA) indicating an address of memory cells in which data included in the memory device 100 is to be stored.

The memory controller 200 may control the memory device 100 to perform the program operation, the read operation, or the erase operation in response to a request from the host 400. During the program operation, the memory controller 200 may provide a write command, the PBA, and the data to the memory device 100. During the read operation, the memory controller 200 may provide a read command and the PBA to the memory device 100.

During the erase operation, the memory controller 200 may provide an erase command and the PBA to the memory device 100.

In an embodiment, the memory controller 200 may generate and transmit the command, the address, and the data to the memory device 100 regardless of the request from the host 400. For example, the memory controller 200 may provide the command, the address, and the data to the memory device 100 so as to perform background operations such as a program operation for wear leveling and a program operation for garbage collection.

In an embodiment, the memory controller 200 may control at least two memory devices 100. In this case, the memory controller 200 may control the memory devices 100 according to an interleaving method so as to improve operation performance. The interleaving method may be an operation method for overlapping operation periods of at least two memory devices 100.

The host 400 may communicate with the storage device 50 using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
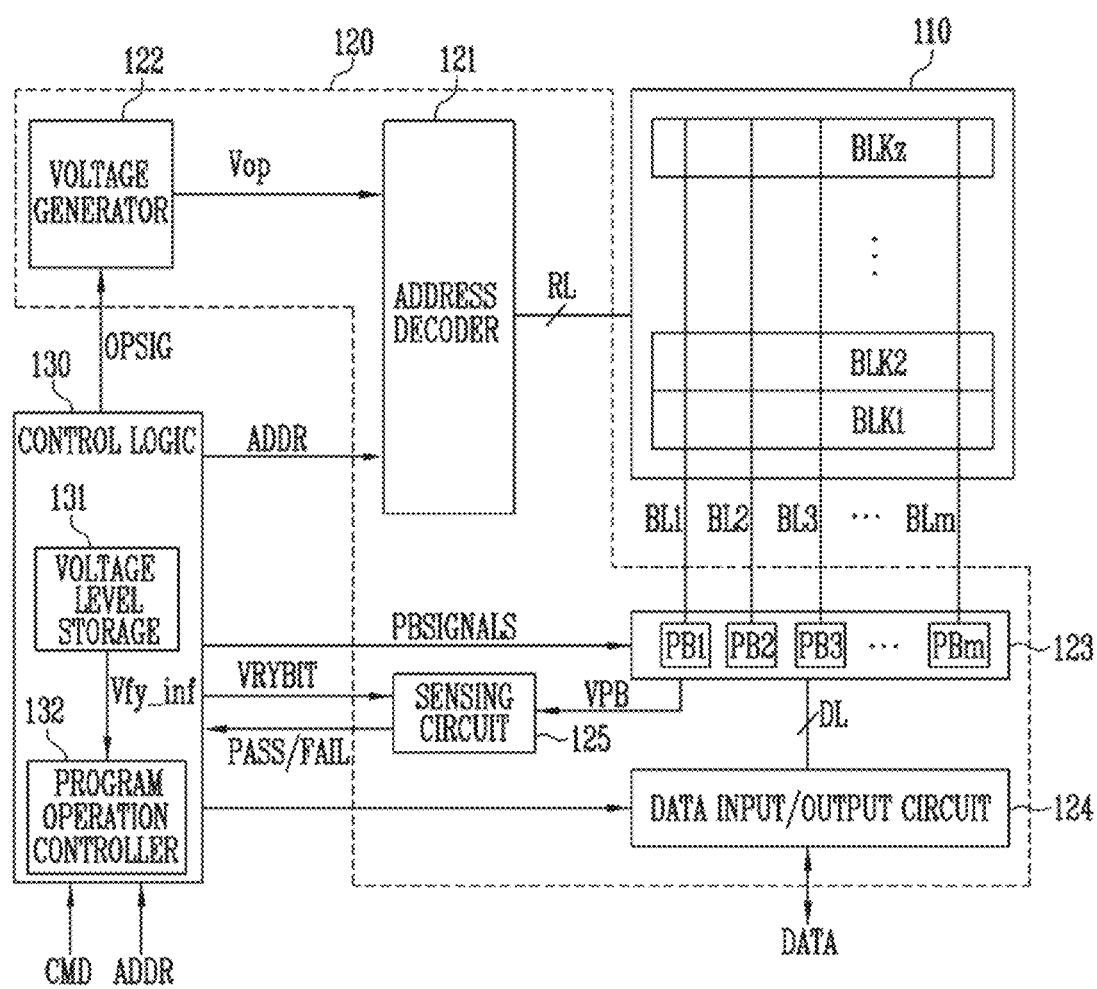
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. As an embodiment, the plurality of memory cells are non-volatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single-level cell (SLC) that stores one data bit, a multi-level cell (MLC) that stores two data bits, a triple-level cell (TLC) that stores three data bits, or a quad-level cell (QLC) that stores four data bits The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address of the received address ADDR. The address decoder 121 may select at least one word line among the word lines of the selected memory block according to the decoded row address. The address decoder 121 may apply an operation voltage Vop supplied from the voltage generator 122 to a selected word line.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present disclosure, the erase operation of the memory device 100 is performed in memory block units. The address ADDR input to the memory device 100 during the erase operation includes a block address. The address decoder 121 may decode the block address and select one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an example, the voltage generator 122 may generate an internal power voltage by regulating the external power voltage. The internal power voltage generated by the voltage generator 122 is used as an operation voltage of the memory device 100.

As an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of dummy program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors in response to the control logic 130 to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permit voltage (for example, a ground voltage) is applied may have an increased threshold voltage. A threshold voltage of a memory cell connected to a bit line to which a program inhibit voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL and store the read data DATA in the first to m-th page buffers PB1 to PBm.

During the erase operation, the read and write circuit 123 may float the bit lines BL. As an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be implemented as hardware, software, or a combination of hardware and software. For example, the control logic 130 may be a control logic circuit operating in accordance with an algorithm and/or a processor executing control logic code. The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the address ADDR, a read and write circuit control signal PBSIGNALS, and the permission bit VRYBIT in response to the command CMD and the address ADDR. The control logic 130 may output the operation signal OPSIG to the voltage generator 122, output the address ADDR to the address decoder 121, output the read and write control signal to the read and write circuit 123, and output the permission bit VRYBIT to the sensing circuit 125. In addition, the control logic 130 may determine whether the verify operation is passed or failed in response to the pass or fail signal PASS/FAIL output by the sensing circuit 125.

In an embodiment, the control logic 130 may further include a voltage level storage 131 and a program operation controller 132.

In an embodiment, the voltage level storage 131 may store information on a level of a program verify voltage applied to the selected word line during a program verify operation for selected memory cells.

Specifically, the information on the level of the program verify voltage may include level information of the program verify voltage to be applied to the selected word line according to a corresponding program loop. Each of the plurality of program loops included in the program operation may include an operation of applying the program voltage and the program verify operation of applying the verify voltages.

The program operation may perform a plurality of program loops to program so that the selected memory cells have any one of a plurality of target program states. Each of the plurality of program loops may include a program voltage application step of applying the program voltage and a verify step of determining whether memory cells are programmed by applying the verify voltages.

In an embodiment, the verify voltage applied to the word line selected in the program verify operation included in each program loop may be different for each program loop according to the verify voltage level stored in the voltage level storage 131. As an embodiment, the verify voltage level stored in the voltage level storage 131 may be different according to the number of program states that are verified in each program loop included in the program operation. Content of the voltage level storage 131 is described later in detail.

In an embodiment, the program operation controller 132 may control the peripheral circuit 120 to perform the program operation and the program verify operation on a plurality of memory cells based on the information Vfy_inf on the level of the program verify voltage received from the voltage level storage 131.

In an embodiment, the control logic 130 may include a counter (not shown) that counts the number of times that the verify voltages corresponding to the target program states of the plurality of memory cells are applied to the selected word line as the plurality of program loops progress. The voltage level storage 131 may include the information Vfy_inf on the level of the verify voltage according to a size of a value of the counter.

In an embodiment, the program operation controller 132 may control the peripheral circuit 120 to apply different verify voltages to the selected word line for each program loop included in the program operation for the selected memory cells, during the program verify operation. At this time, the different verify voltages applied to the selected word line may be determined based on the information Vfy_inf on the level of the verify voltage received from the voltage level storage 131.

In an embodiment, the program operation controller 132 may control the peripheral circuit 120 to increase and apply the verify voltage corresponding to the target program state of each memory cell as the program loop is progressed during the program verify operation included in a corresponding program loop. In an embodiment, the program operation controller 132 may control the peripheral circuit 120 to apply the same verify voltage as the verify voltage applied to the selected word line during a program verify operation included in a previously performed program loop regarding some of the verify voltages corresponding to the target program state of each memory cell. In an embodiment, the program operation controller 132 may control the peripheral circuit 120 so that the selected memory cells apply a verify voltage of a negative voltage and a verify voltage of a positive voltage regarding some of the verify voltages corresponding to the target program states during the program verify operation.

Figure 3:
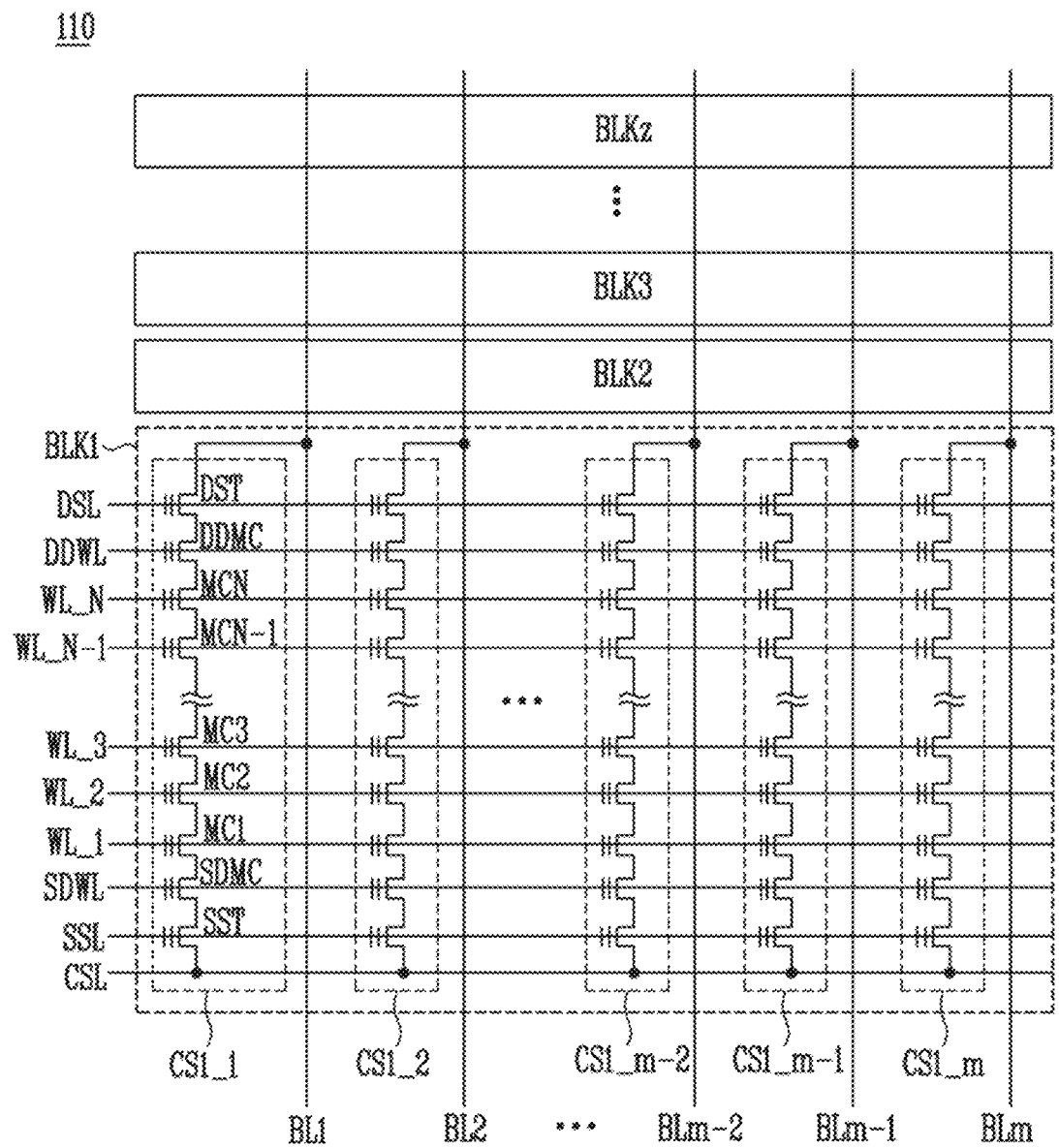
FIG. 3 is a diagram illustrating a memory cell array of FIG. 2.

FIG. 3 is a diagram illustrating the memory cell array of FIG. 2.

Referring to FIG. 3, first to z-th memory blocks BLK1 to BLKz are commonly connected to first to m-th bit lines BL1 to BLm. In FIG. 3, for convenience of description, elements included in the first memory block BLK1 among the plurality of memory blocks BLK1 to BLKz are shown, and elements included in each of the remaining memory blocks BLK2 to BLKz are omitted. It will be understood that each of the remaining memory blocks BLK2 to BLKz is configured similarly to the first memory block BLK1.

The memory block BLK1 may include a plurality of cell strings CS1_1 to CS1_$m$ ($m$ is a positive integer). The first to m-th cell strings CS1_1 to CS1_$m$ are connected to the first to m-th bit lines BL1 to BLm, respectively. Each of the first to m-th cell strings CS1_1 to CS1_$m$ includes a drain select transistor DST, a drain dummy cell DDMC connected in series, a plurality of memory cells MC1 to MCN (N is a positive integer) connected in series, a source dummy cell SDMC connected in series, and a source select transistor SST.

A gate terminal of the drain select transistor DST included in each of the first to m-th cell strings CS1_1 to CS1_$m$ is connected to a drain select line DSL. A gate terminal of the drain dummy cell DDMC included in each of the first to m-th cell strings CS1_1 to CS1_$m$ is connected to a drain dummy word line DDWL. Gate terminals of the first to N-th memory cells MC1 to MCN included in each of the first to m-th cell strings CS1_1 to CS1_$m$ are connected to first to N-th word lines WL_1 to WL_N. A gate terminal of the source dummy cells SDMC included in each of the first to m-th cell strings CS1_1 to CS1_$m$ is connected to a source dummy word line SDWL, and a gate terminal of the source select transistor SST included in each of the first to m-th cell strings CS1_1 to CS1_$m$ is connected to a source select line SSL.

For convenience of description, a structure of the cell string is described based on the first cell string CS1_1 among the plurality of cell strings CS1_1 to CS1_$m$. However, it will be understood that each of the remaining cell strings CS1_2 to CS1_$m$ is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the drain dummy cell DDMC included in the first cell string CS1_1. The first to N-th memory cells MC1 to MCN are connected in series with each other. The drain dummy cell DDMC and the N-th memory cell MCN are connected in series, and the first memory cell MC1 is connected to the source dummy cell SDMC in series. A drain terminal of the source select transistor SST included in the first cell string CS1_1 is connected to a source terminal of the source dummy cell SDMC included in the first cell string CS1_1. A source terminal of the source select transistor SST included in the first cell string CS1_1 is connected to a common source line CSL. As an embodiment, the common source line CSL may be commonly connected to the first to z-th memory blocks BLK1 to BLKz.

The drain select line DSL, the drain dummy word line DDWL, the first to N-th word lines WL_1 to WL_N, the source dummy word line SDWL, and the source select line SSL are included in the row lines RL of FIG. 2. The drain select line DSL, the drain dummy word line DDWL, the first to N-th word lines WL_1 to WL_N, the source dummy word line SDWL, and the source select line SSL are controlled by the address decoder 121. The common source line CSL is controlled by the control logic 130. The first to m-th bit lines BL1 to BLm are controlled by the read and write circuit 123.

Figure 4:
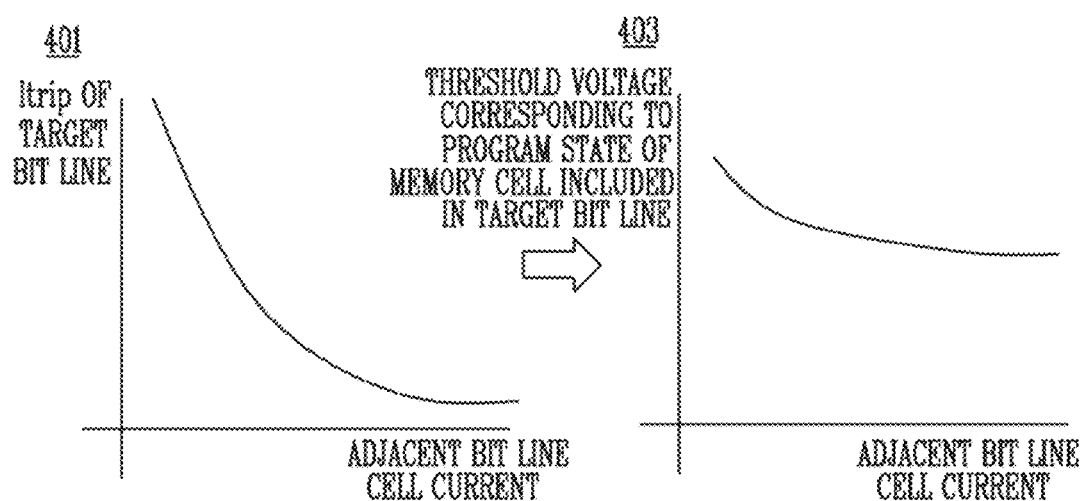
FIG. 4 is a diagram illustrating an effect of adjacent bit lines among first to m-th bit lines BL1 to BLm included in the memory cell array of FIG. 3 during a program operation.

FIG. 4 is a diagram illustrating an effect of adjacent bit lines among the first to m-th bit lines BL1 to BLm included in the memory cell array of FIG. 3 during the program operation.

A first graph 401 of FIG. 4 shows a size of Itrip of a target bit line according to a cell current of an adjacent bit line. A second graph 403 of FIG. 4 shows a magnitude of a threshold voltage corresponding to a program state of a memory cell included in the target bit line according to the cell current of the adjacent bit line. As the program loop is progressed, a probability that the selected memory cells connected to the selected word line are in a program state may increase. A smaller cell current flows through a bit line to which the memory cells in the program state are connected than a bit line to which memory cells in an erase state are connected.

For example, referring to FIG. 3, as the program loop is progressed, a probability that memory cells connected to bit lines BLm-2 and BLm adjacent to the target bit line BLm-1 in a program state may increase. Therefore, the cell current flowing through the adjacent bit lines BLm-2 and BLm may decrease. As the cell current of the adjacent bit lines BLm-2 and BLm decreases, the cell current of the target bit line BLm-1 may also decrease.

Referring to the first graph 401 of FIG. 4, as the cell current flowing through the adjacent bit line decreases, the Itrip of the target bit line may increase. Referring to the second graph 403, as the cell current flowing through the adjacent bit line decreases, a threshold voltage corresponding to the program state of the memory cell included in the target bit line may be affected and increased. Therefore, during the program verify operation on the selected memory cells, the threshold voltage corresponding to the program state of the selected memory cell, which is required be constant, is affected and increased by the adjacent bit lines BLm-2 and BLm, a phenomenon that the program verify voltage appears to have changed occurs. Thus, the reliability of data decreases.

Figure 5:
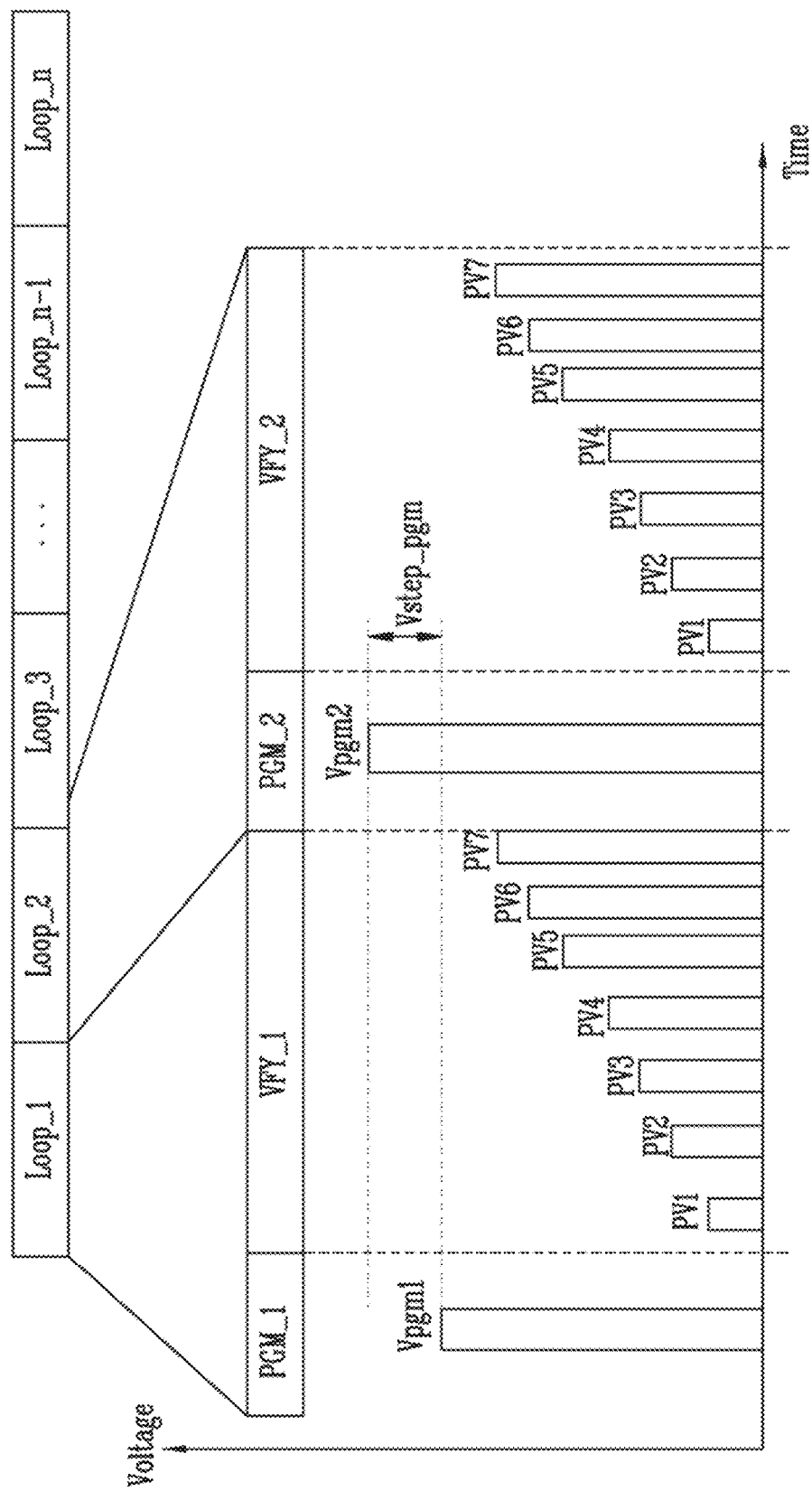
FIG. 5 is a diagram illustrating a program loop.

FIG. 5 is a diagram illustrating the program loop.

Referring to FIG. 5, the program operation may include a plurality of program loops Loop_1 to Loop_n (n is a natural number equal to or greater than 1). The memory device may perform a plurality of program loops to program selected memory cells to have a plurality of target program states.

Each of the plurality of program loops may include one of program voltage application steps PGM_1 to PGM_n and one of verify steps VFY_1 to VFY_n.

In the program voltage application step, a program voltage application operation of applying the program voltage to the selected word line connected to the selected memory cells may be performed. Each of the memory cells selected by the program voltage application operation may be programmed to a target state among a plurality of states. The target state may be determined according to data to be programmed to the selected memory cells.

In the verify step, a program verify operation of determining whether the selected memory cells are programmed by applying the verify voltages to the selected word line may be performed. The program verify operation may include a state verify operation corresponding to each of at least one target program state. The state verify operation may be an operation of applying the verify voltage corresponding to the target program state to the selected word line to determine whether the selected memory cells are programmed to the target program state.

In an embodiment, the program voltage may be determined according to an incremental step pulse programming (ISPP) method. That is, a level of the program voltage may be gradually increased or decreased by a predetermined voltage increase as the program loops are repeated. The number of times of application of program voltages, a voltage level, a voltage application time, and the like used in each program loop may be determined in various forms according to control of the memory controller.

A pass voltage may be applied to the unselected word lines which are remaining word lines except for the selected word line. In an embodiment, the pass voltages having the same level may be applied to the unselected word lines. In an embodiment, the pass voltage may have different levels according to a position of the word line.

A ground voltage may be applied as a program permit voltage to selected bit lines connected to a memory cell to be programmed. A program inhibit voltage may be applied to unselected bit lines, which are bit lines connected to memory cells except for the memory cells to be programmed.

In the program verify step, the memory device may apply the verify voltage to the selected word lines and may apply a verify pass voltage to the unselected word lines. The memory device may sense a voltage or a current output through bit lines respectively connected to the memory cells connected to the selected word line, and determine whether the verify step is passed or failed based on a sensed result.

In the program voltage application step, the selected memory cells may be programmed to any one of first to m-th (m is a natural number equal to or greater than 2) states.

In the verify step, a state verify operation on at least one target program state among the first to m-th states may be performed. For example, when memory cells to be programmed to a k-th (k is a natural number equal to or greater than 1 and equal to or less than m) state among the selected memory cells are read as an off-cell by a verify voltage corresponding to the k-th state, the state verify operation on the k-th state is may be passed.

In FIG. 5, when the selected memory cells are triple-level cells (TLCs) storing three data bits, the selected memory cells may be programmed to any one of the erase state and first to seventh program states. The number of data bits stored in the memory cell is not limited to the present embodiment.

When the first program loop Loop_1 is performed, after a first program voltage Vpgm1 is applied, first to seventh verify voltages PV1 to PV7 are sequentially applied to verify the program states of the plurality of memory cells. At this time, the memory cells of which the target state is the first program state may be verified by the first verify voltage PV1, the memory cells of which the target state is the second program state may be verified by the second verify voltage PV2, and the memory cells of which the target state is the third program state may be verified by the third verify voltage PV3. In the same manner, the memory cells may be verified by one of the verify voltages PV1 to PV7 corresponding to the target program state. The number of verify voltages of the memory cells is not limited to the present embodiment.

The memory cells of which the verification is passed by the verify voltages PV1 to PV7 may be determined to have the target state, and then may be program-inhibited in the second program loop Loop_2. The program inhibit voltage may be applied to bit lines connected to the program-inhibited memory cells. A second program voltage Vpgm2 higher than the first program voltage Vpgm1 by a step voltage Vstep_pgm is applied to the word line selected in the second program loop Loop_2.

Thereafter, the program verify operation is performed identically to the program verify operation of the first program loop Loop_1. Exemplarily, the verify pass indicates that the memory cell is read as the off-cell by a corresponding verify voltage.

As described above, when the memory device programs the TLC, the memory device verifies the memory cells of which respective program states are set as the target states using the first to seventh verify voltages PV1 to PV7.

In another embodiment, because a probability that a threshold voltage of cells in the erased state is rapidly increased and is low at the beginning of the program, a blind program operation of omitting a verify operation using a verify voltage of a high level is omitted and performing a verify operation using a verify voltage of a low level may be implemented. When the blind program operation is performed, because the number of verify operations may be reduced, a program operation time may be shortened.

Specifically, the number of times the program voltage is applied for performing the blind program operation may be set in advance. For example, in each program verify operation included in the first program loop Loop_1 and the second program loop Loop_2, the first verify voltage PV1 may be applied to verify the program state of the memory cells. In each program verify operation included in the third program loop Loop_3 and the fourth program loop Loop_4, the first verify voltage PV1 and the second verify voltage PV2 may be sequentially applied to verify the program state of the memory cells. Thereafter, similar to the program verify operation of the first to fourth program loops Loop_1 to Loop_4, the program verify operation may be performed using verify voltages set in advance for each program loop.

In various embodiments, when the program operation is not completed within the preset number of program loops, the program operation may be failed. When the program operation is completed within the preset number of program loops, the program operation may be passed. Whether the program operation is completed may be determined by whether all program verify operations on the selected memory cells are passed. When all program verify operations are passed, a next program loop might not be performed.

Figure 6:
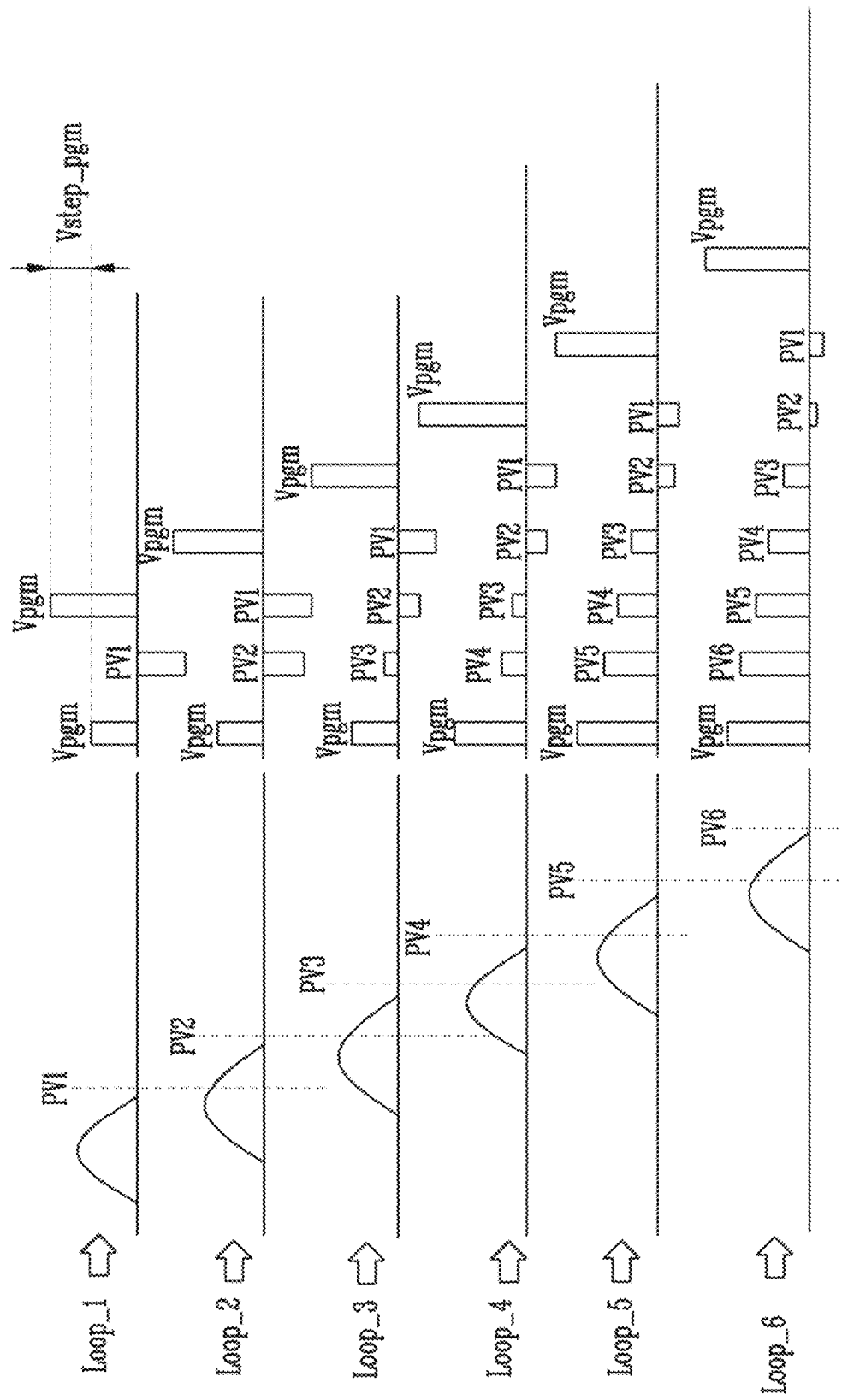
FIG. 6 is a timing diagram illustrating a program method according to an embodiment.

FIG. 6 is a timing diagram illustrating a program method according to an embodiment.

Referring to FIG. 6, a program loop for omitting some verify voltages and applying the verify voltage in the program verify operation included in the plurality of program loops according to the blind program method described with reference to FIG. 5 is shown. According to an embodiment of the present disclosure, during each program verify operation included in the plurality of program loops, a magnitude and a type of the verify voltages applied to the selected word line may be determined based on the information stored in the voltage level storage 131 described with reference to FIG. 2. According to another embodiment, during each program operation included in the plurality of program loops, the magnitudes of the verify voltages applied to the selected word line may be calculated by the program operation controller 132 described with reference to FIG. 2.

Specifically, the magnitude of the verify voltages applied to the selected word line in the verify operation may be a magnitude obtained by adding each default verify voltage to a value obtained by multiplying by a reference offset value and a count value corresponding to each of the verify voltages. At this time, the magnitude of the default verify voltage may be a verify voltage when the verify voltage corresponding to the target program state of the selected memory cells is first applied to the selected word line. The magnitude of the default verify voltage corresponding to the target program states of each of the selected memory cells may be predetermined in the voltage level storage 131 in advance.

In an embodiment, the count value may be different for each of the verify voltages applied to the selected word line. For example, the count value may correspond to each of the verify voltages applied to the selected word line in the verify operation included in one program loop. In addition, the count value may be the number of program states higher than the target program state corresponding to the corresponding verify voltage among the target program states of the plurality of verified memory cells in the verify operation.

In an embodiment, the offset value may be the same while the plurality of program loops progress. In another embodiment, the offset value may be different according to the target program state to be verified. In addition, as the program loop is progressed, the offset value may be continuously changed.

Specifically, as the plurality of program loops progress, the offset value may gradually increase. The offset value may be stored in the voltage level storage 131. Therefore, the magnitude of the verify voltages corresponding to the target program state applied to the selected word line may be different in each of the plurality of program loops as the offset value and the count value change.

For example, referring to FIG. 6, the first to sixth program loops Loop_1 to Loop_6 may be performed for the program operation of the selected memory cells. For convenience of description, in the program verify operations included in each of the first to sixth program loops Loop_1 to Loop_6, a reference offset may be assumed to be 20 mV. At this time, the reference offset may be different for each target program state corresponding to the verify voltage to be applied to the selected word line, and may be different for each program loop. In addition, 20 mV is only an example, and a reference offset may have a different value.

When the first program loop Loop_1 is performed, after the first program voltage Vpgm for the first program loop Loop_1 is applied to the selected word line, in order to verify the state of the plurality of memory cells, the first verify voltage PV1 may be applied. At this time, the memory cells of which the target program state is the first program state may be verified by the first verify voltage PV1. A magnitude of the first verify voltage PV1 may be −1V. The first verify voltage PV1 applied to the selected word line in the first program loop Loop_1 is a verify voltage first applied to verify the memory cells of which the target program state is the first program state. Therefore, a default verify voltage for verifying the memory cells of which the target program state is the first program state may be the first verify voltage PV1 of the first program loop Loop_1. At this time, because there is no program state higher than the first program state corresponding to the first verify voltage PV1, in the verify operation included in the first program loop Loop_1, a count value corresponding to the first verify voltage PV1 of the first program loop Loop_1 is 0. After the first verify voltage PV1 is applied to the selected word line, the second program voltage Vpgm may be applied.

When the second program loop Loop_2 is performed, after the first program voltage Vpgm for the second program loop Loop_2 is applied to the selected word line, in order to verify the state of the first program memory cells, the second verify voltage PV2 may be applied. The memory cells of which the target program state is the second program state may be verified by the second verify voltage PV2. A magnitude of the second verify voltage PV2 may be −0.1V. Similar to the first program loop Loop_1, the second verify voltage PV2 is a voltage first applied to the selected word line to verify the memory cells of which the target program state is the second program state. Therefore, a default verify voltage for verifying the memory cells of which the target program state is the second program state may be the second verify voltage PV2 of the second program loop Loop_2. At this time, because there is no program state higher than the second program state corresponding to the second verify voltage PV2, in the verify operation included in the second program loop Loop_2, the count value corresponding to the second verify voltage PV2 of the second program loop Loop_2 is 0.

After the second verify voltage PV2 of the second program loop Loop_2 is applied to the selected word line, the first verify voltage PV1 of the second program loop Loop_2 for verifying the memory cells of which the target program state is the first program state may be applied. At this time, the magnitude of the first verify voltage PV1 may correspond to a value obtained by adding the first verify voltage PV1 of the first program loop Loop_1, which is the default verify voltage, and a value obtained by multiplying the count value corresponding to the first verify voltage PV1 and an offset of 20 mV. At this time, because there is the second program state higher than the first program state, the count value corresponding to the first verify voltage PV1 of the second program loop Loop_2 is 1. Therefore, the magnitude of the first verify voltage PV1 of the second program loop Loop_2 is −0.98V obtained by adding −1V which is the default verify voltage, and the value obtained by multiplying the count value of 1 and the offset of 20 mV. After the first verify voltage PV1 of the second program loop Loop_2 is applied to the selected word line, the second program voltage Vpgm of the second program loop Loop_2 may be applied.

In an embodiment, the third to sixth program loops Loop_3 to Loop_6 may be performed identically to the previously performed first and second program loops Loop_1 and Loop_2. According to an embodiment, even though the same program state is verified for each of the first to sixth program loops Loop_1 to Loop_6, the magnitude of the verify voltage corresponding to the program state to be verified may vary.

In another embodiment, during the verify operation included in each program loop, as a level magnitude of the verify voltage to be applied to the selected word line decreases, the verify voltage may be first applied to the selected word line. In addition, according to an embodiment, during the verify operation included in one program loop, some of the verify voltages applied to the selected word line may have a negative voltage level and some may have a positive voltage level.

Figure 7:
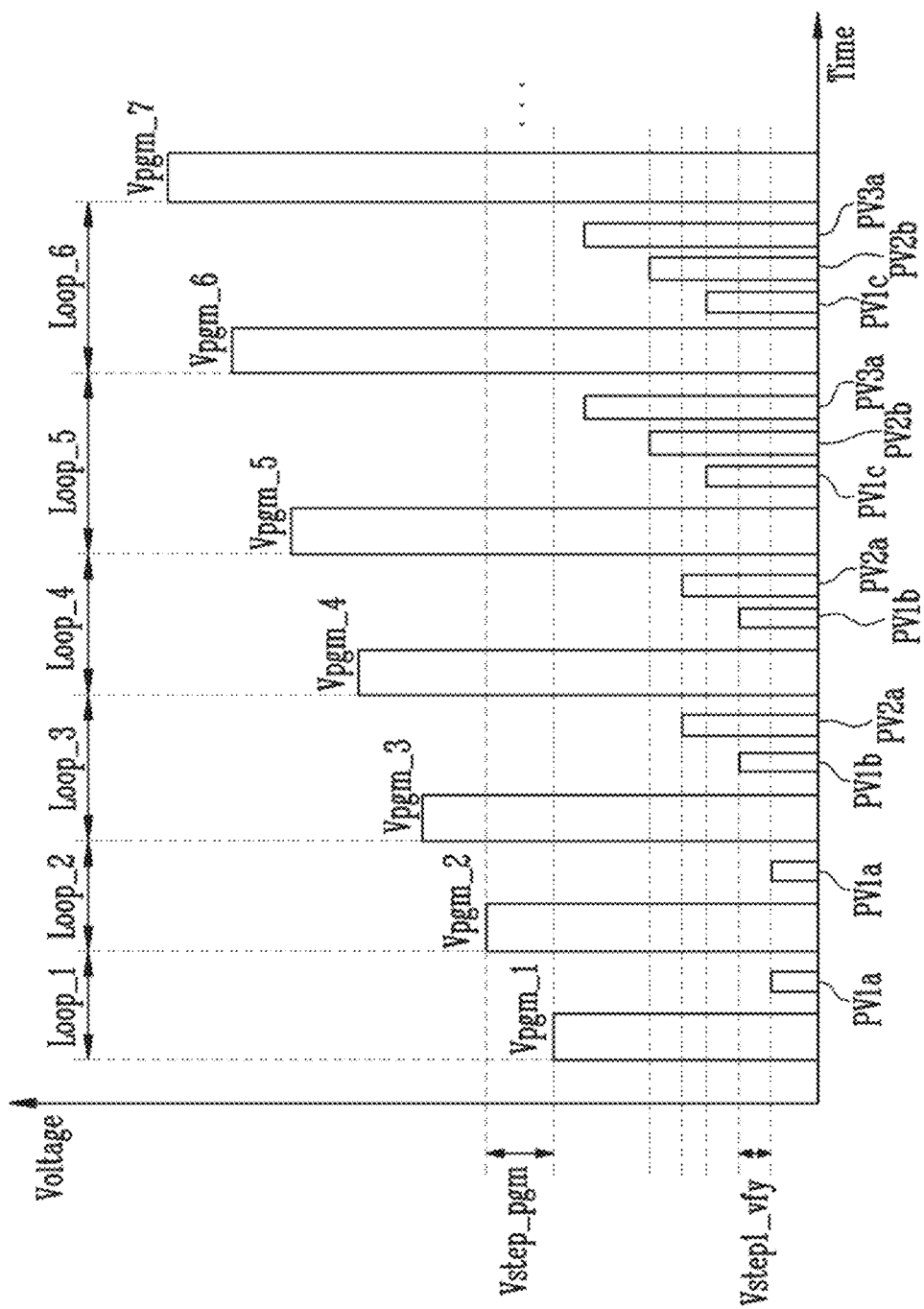
FIG. 7 is a timing diagram illustrating a program method according to an embodiment.

FIG. 7 is a timing diagram illustrating a program method according to an embodiment.

Referring to FIG. 7, a program loop for omitting some verify voltages and applying the verify voltage in the program verify operation included in the plurality of program loops according to the blind program method described with reference to FIG. 5 is shown. According to an embodiment of the present disclosure, during each program verify operation included in the plurality of program loops, a magnitude and a type of the verify voltages applied to the selected word line may be determined based on the information stored in the voltage level storage 131 described with reference to FIG. 2.

According to an embodiment of the present disclosure, when the first program loop Loop_1 is performed, after the first program voltage Vpgm_1 is applied, in order to verify the state of the plurality of memory cells, a first verify voltage PV1a is applied. A second program voltage Vpgm_2 higher than the first program voltage Vpgm_1 by a step voltage Vstep_pgm is applied to the selected word line in the second program loop Loop_2. Thereafter, the first verify voltage PV1a corresponding to the first program state may be applied.

A third program voltage Vpgm_3 higher than the second program voltage Vpgm_2 by the step voltage Vstep_pgm may be applied to the selected word line in the third program loop Loop_3. Thereafter, in order to verify the program state of the plurality of memory cells, an increased first verify voltage PV1b corresponding to the first program state and a second verify voltage PV2a corresponding to the second program state may be applied. At this time, the first verify voltage PV1b corresponding to the first program state applied in the third program loop Loop_3 may be higher than the first verify voltage PV1a applied in the first and second program loops Loop_1 and Loop_2 by a step voltage Vstep1_vfy. A magnitude of the step voltage Vstep1_vfy may be different according to the voltage level information stored in the voltage level storage 131 described with reference to FIG. 2.

A fourth program voltage Vpgm_4 higher than the third program voltage Vpgm_3 by the step voltage Vstep_pgm may be applied to the selected word line in the fourth program loop Loop_4. Thereafter, in order to verify the program state of the plurality of memory cells, the increased first verify voltage PV1b corresponding to the first program state and the second verify voltage PV2a corresponding to the second program state may be applied.

A fifth program voltage Vpgm_5 higher than the fourth program voltage Vpgm_4 by the step voltage Vstep_Pgm may be applied to the selected word line in the fifth program loop Loop5. Thereafter, in order to verify the program state of the plurality of memory cells, a first verify voltage PV1c corresponding to the first program state and a second verify voltage PV2b corresponding to the second program state may be applied to the selected word line. In addition, a third verify voltage PV3a corresponding to the third program state may be applied to the selected word line. At this time, a magnitude of the first verify voltage PV1c applied in the fifth program loop Loop_5 may be higher than the first verify voltage PV1b applied in the third and fourth program loops Loop_3 and Loop_4 by the step voltage Vstep1_vfy. In addition, a magnitude of the second verify voltage PV2b applied after the first verify voltage PV1c is applied to the selected word line may be higher than the second verify voltage PV2a applied in the third and fourth program loops Loop_3 and Loop_4 by the step voltage Vstep1_vfy. The magnitude of the step voltage Vstep1_vfy may be different according to the voltage level information stored in the voltage level storage 131.

In an embodiment, the plurality of program loops Loop_1 to Loop_n may be performed identically to the first to fifth program loops Loop_1 to Loop_5 described above. At this time, as the plurality of program loops progress, the number of verify voltages corresponding to the number of target program states of the memory cells to be verified in the verify operation included in each program loop may increase. In addition, when the number of target program states of the memory cells to be verified in each program loop increases, the magnitude of the verify voltage respectively corresponding thereto may increase. The number of verify voltages included in each program loop and the magnitude of the verify voltage may be determined according to the voltage level information stored in the voltage level storage 131.

For convenience of description, a verify voltage corresponding to a new target program state is applied after repetition of two program loops among the plurality of program loops Loop_1 to Loop_n, but is not limited thereto.

Figure 8:
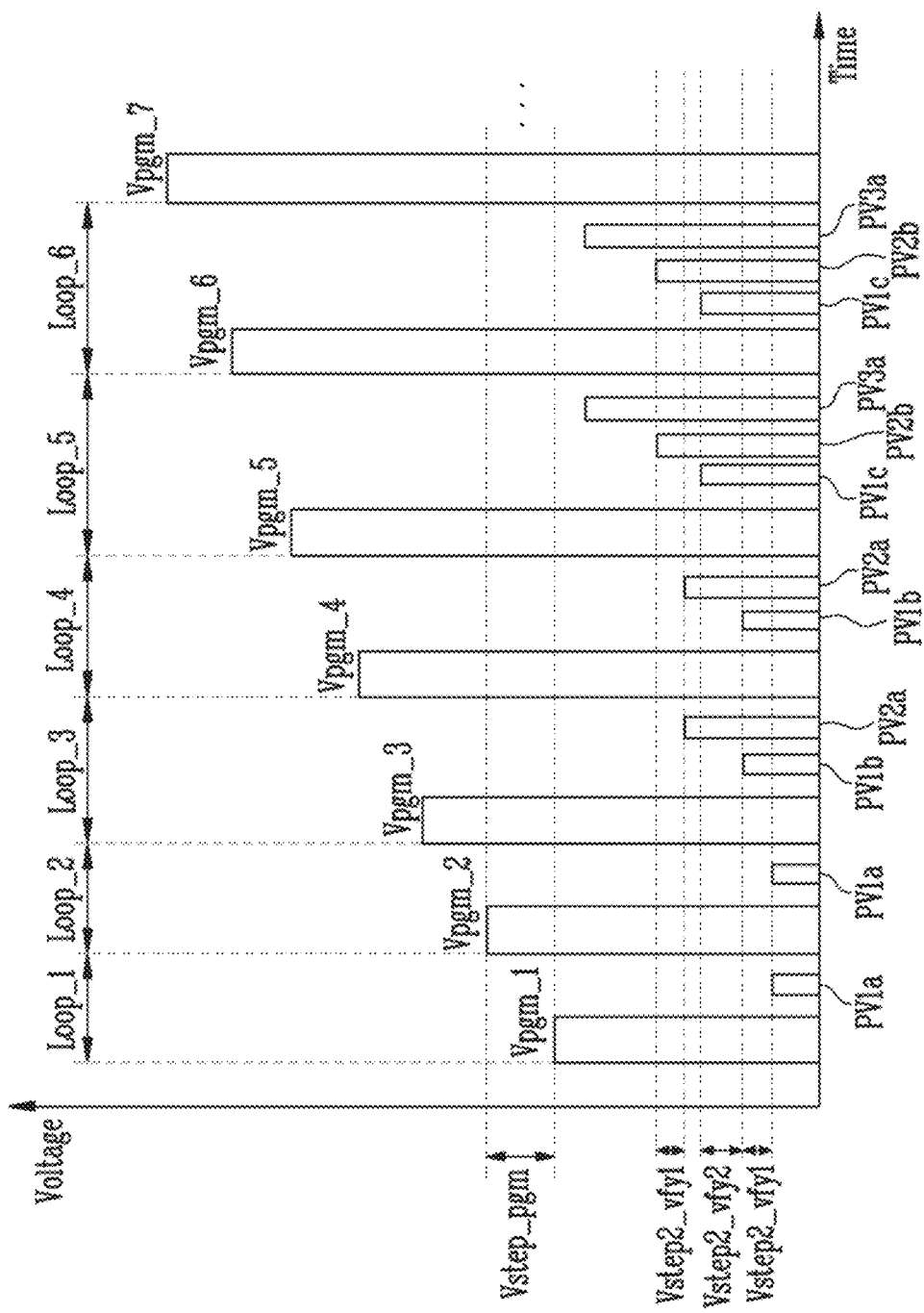
FIG. 8 is a timing diagram illustrating a program method according to an embodiment.

FIG. 8 is a timing diagram illustrating a program method according to an embodiment.

Referring to FIG. 8, a program loop for omitting some verify voltages and applying the verify voltage in the program verify operation included in the plurality of program loops according to the blind program method described with reference to FIG. 5 is shown. According to an embodiment of the present disclosure, a magnitude and a type of the verify voltages applied to the selected word line may be determined based on the information stored in the voltage level storage 131 described with reference to FIG. 2.

According to an embodiment of the present disclosure, the first to second program loops Loop_1 to Loop_2 the same as the first to second program loops Loop_1 to Loop_2 described with reference to FIG. 7 may be performed.

A third program voltage Vpgm_3 higher than the second program voltage Vpgm_2 by the step voltage Vstep_pgm may be applied to the selected word line in the third program loop Loop_3. Thereafter, in order to verify the program state of the plurality of memory cells, an increased first verify voltage PV1b corresponding to the first program state and a second verify voltage PV2a corresponding to the second program state may be applied. At this time, the first verify voltage PV1b applied in the third program loop Loop_3 may be higher than the first verify voltage PV1a applied in the first and second program loops Loop_1 and Loop_2 by a first step voltage Vstep2_vfy1. A magnitude of the first step voltage Vstep2_vfy1 may be different according to the voltage level information stored in the voltage level storage 131 described with reference to FIG. 2.

A fourth program voltage Vpgm_4 higher than the third program voltage Vpgm_3 by the step voltage Vstep_pgm may be applied to the selected word line in the fourth program loop Loop_4. Thereafter, in order to verify the program state of the plurality of memory cells, the first verify voltage PV1b and the second verify voltage PV2a may be applied.

A fifth program voltage Vpgm_5 higher than the fourth program voltage Vpgm_4 by the step voltage Vstep_Pgm may be applied to the selected word line in the fifth program loop Loop5. Thereafter, in order to verify the program state of the plurality of memory cells, a first verify voltage PV1c corresponding to the first program state, a second verify voltage PV2b corresponding to the second program state, and a third verify voltage PV3a corresponding to the third program state may be applied. At this time, a magnitude of the first verify voltage PV1c corresponding to the first program state applied in the fifth program loop Loop_5 may be higher than the first verify voltage PV1b applied in the third and fourth program loops Loop_3 and Loop_4 by a second step voltage Vstep2_vfy2. At this time, a magnitude of the second step voltage Vstep2_vfy2 may be greater than the first step voltage Vstep2_vfy1. In addition, a magnitude of the second verify voltage PV2b applied after the first verify voltage PV1c is applied to the selected word line may be higher than the second verify voltage PV2a applied in the third and fourth program loops Loop_3 and Loop_4 by the step voltage Vstep2_vfy1.

The magnitudes of the step voltages Vstep2_vfy1 and Vstep2_vfy2 may be different according to the voltage level information stored in the voltage level storage 131. In addition, as the plurality of program loops Loop_1 to Loop_n progress, the magnitudes of verify voltages corresponding to each target program state may increase by the step voltage. At this time, the magnitude of the step voltage may vary for each program loop. Specifically, in the verify operation included in the program loop, whenever the number of target program states of the memory cells to be verified increases, the magnitudes of the verify voltages applied to the selected word line may increase by the step voltage. In the program operation, as the number of times the verify voltage corresponding to the target program state is applied to the selected word line increases, the magnitude of the step voltage may increase.

In an embodiment, the plurality of program loops Loop_1 to Loop_n may be performed identically to the first to fifth program loops Loop_1 to Loop_5. During the program verify operation included in each of the plurality of program loops Loop_1 to Loop_n, the step voltage may be different for each of the target program states of some of the plurality of memory cells. At this time, the step voltage may have a higher voltage level as a threshold voltage corresponding to the target program state of the memory cells is higher.

For convenience of description, a verify voltage corresponding to a new target program state is applied after repetition of two program loops among the plurality of program loops Loop_1 to Loop_n, but is not limited thereto.

Figure 9:
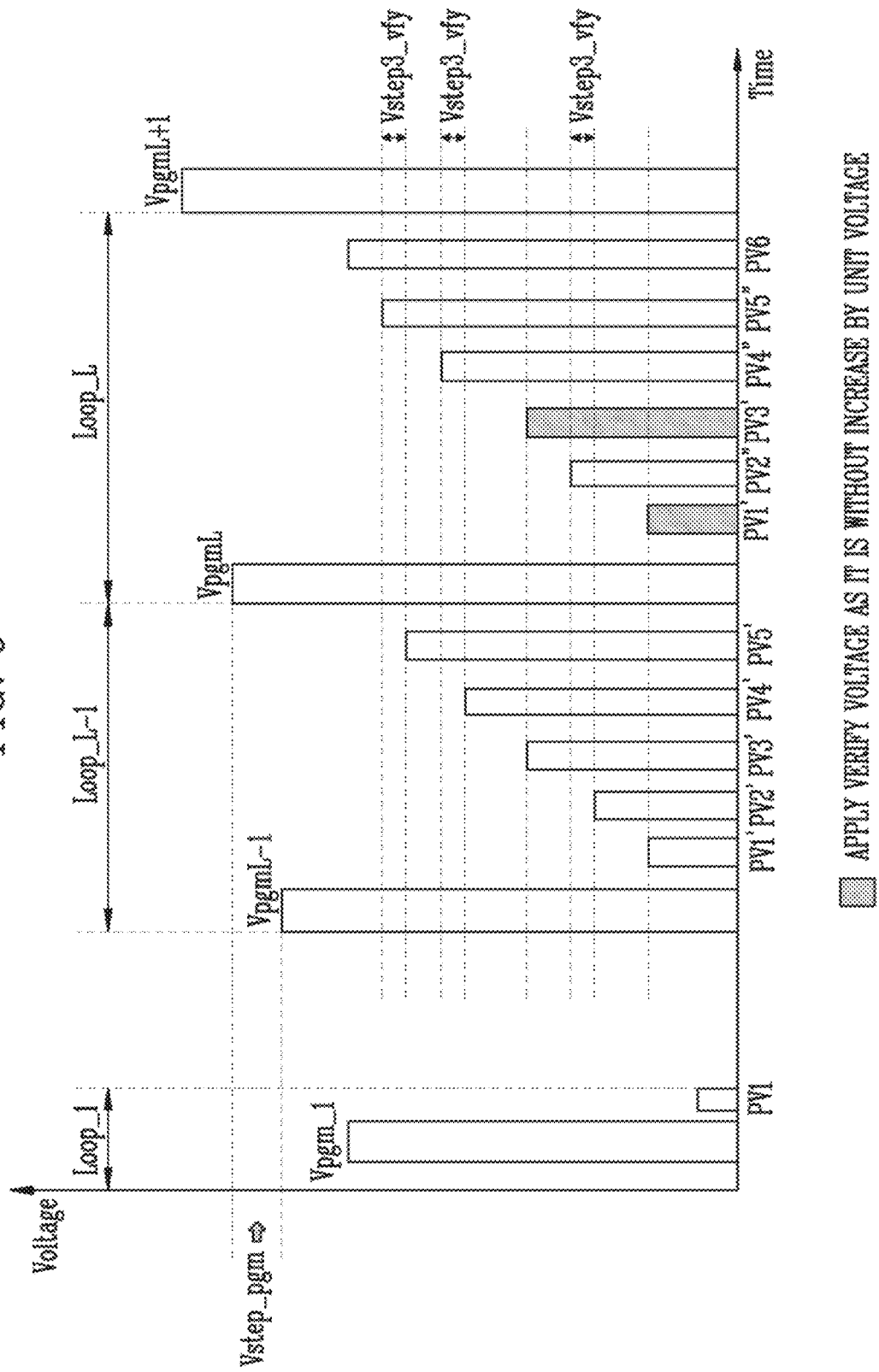
FIG. 9 is a timing diagram illustrating a program method according to an embodiment.

FIG. 9 is a timing diagram illustrating a program method according to an embodiment.

Referring to FIG. 9, a program loop for omitting some verify voltages and applying the verify voltage in the program verify operation included in the plurality of program loops according to the blind program method described with reference to FIG. 5 is shown. During each program verify operation included in the plurality of program loops, a magnitude and a type of the verify voltages applied to the selected word line may be determined based on the information stored in the voltage level storage 131 described with reference to FIG. 2.

According to an embodiment of the present disclosure, during the verify operation included in a corresponding program loop among the plurality of program loops, respective verify voltages corresponding to respective target program states, which are applied to the selected word line may be applied. At this time, some of the applied verify voltages may be the same as the verify voltages applied to the selected word line during a verify operation included in a previously performed program loop.

For example, referring to FIG. 9, among the plurality of program loops Loop_1 to Loop_n, an (L−1)-th program loop Loop_L−1 and an L-th program loop Loop_L (L is a natural number greater than 2 and less than n) is shown.

An (L−1)-th program voltage VpgmL−1 may be applied to the selected word line in the (L−1)-th program loop Loop_L−1. Thereafter, in order to verify the program state of the plurality of memory cells, first to fifth verify voltages PV1' to PV5' respectively corresponding to the first to fifth program states may be applied.

An L-th program voltage VpgmL may be applied to the selected word line in the L-th program loop Loop_L performed after the (L−1)-th program loop Loop_L−1. At this time, the L-th program voltage VpgmL may be higher than the (L−1)-th program voltage VpgmL−1 by a step voltage Vstep_pgm. In the program verify operation of the L-th program loop Loop_L, a verify voltage corresponding to a target program state that is not been verified in the (L−1)-th program loop Loop_L−1 may be applied. At this time, in the verify operation included in the L-th program loop, some of the verify voltages respectively corresponding to the plurality of program states may be the same as the verify voltages applied to the selected word line during the verify operation included in the (L−1)-th program loop.

Specifically, in the verify operation included in the L-th program loop, a magnitude of the first verify voltage PV1' corresponding to the first program state may be the same as the first verify voltage PV1' applied during the (L−1)-th program verify operation. Similarly, in the verify operation included in the L-th program loop, a magnitude of the third verify voltage PV3' corresponding to the third program state may be the same as the third verify voltage PV3' applied during the (L−1)-th program verify operation. In addition, in the L-th program loop Loop_L, a second verify voltage PV2" corresponding to the second program state may be applied to the selected word line. Additionally, fourth to sixth program verify voltages PV4" to PV6" corresponding to the fourth to sixth program states may be applied. At this time, the second, fourth, and fifth program verify voltages PV2", PV4", and PV5" may be higher than the corresponding verify voltages PV2', PV4', and PV5' applied in the (L−1)-th program loop Loop_L−1 by a step voltage Vstep3_vfy, respectively.

In an embodiment, the plurality of program loops Loop_1 to Loop_n may be performed identically to the (L−1)-th and L-th program loops Loop_L−1 and Loop_L described above. At this time, as the plurality of program loops progress, the number of verify voltages corresponding to the number of target program states of the memory cells to be verified in the verify operation included in each program loop may increase. In addition, when the target program state of the memory cells to be verified in each program loop increases, magnitudes of the verify voltages respectively corresponding thereto may be partially increased. The number of verify voltages included in each program loop, the magnitude of the verify voltage to be applied to the selected word line in each program loop, and a magnitude of the step voltage Vstep3_vfy may be determined according to the voltage level information stored in the voltage level storage 131.

For convenience of description, the verify voltage corresponding to the first program state and the verify voltage corresponding to the third program state are applied at the same magnitude even though the program loop is progressed. However, the present disclosure is not limited thereto, and verify voltages corresponding to various program states may be constantly applied to the selected word line.

Figure 10:
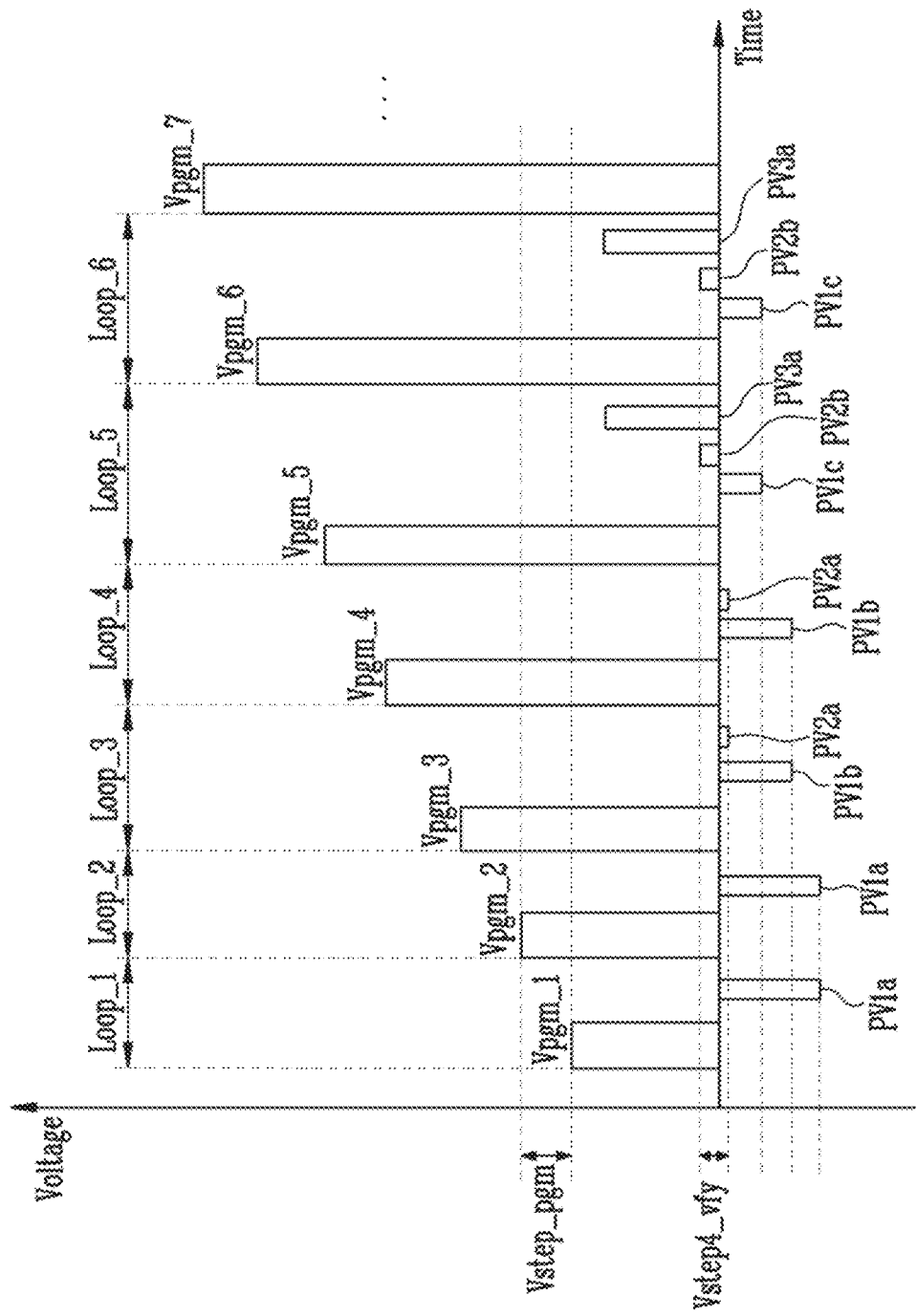
FIG. 10 is a timing diagram illustrating a program method according to an embodiment.

FIG. 10 is a timing diagram illustrating a program method according to an embodiment.

Referring to FIG. 10, a program loop for omitting some verify voltages and applying the verify voltage in the program verify operation included in the plurality of program loops according to the blind program method described with reference to FIG. 5 is shown. During each program verify operation included in the plurality of program loops, a magnitude and a type of the verify voltages applied to the selected word line may be determined based on the information stored in the voltage level storage 131 described with reference to FIG. 2.

According to an embodiment of the present disclosure, when the first program loop Loop_1 is performed, after applying the first program voltage Vpgm_1, in order to verify the program state of the plurality of memory cells, a first verify voltage PV1a is applied. The first verify voltage PV1a may be a negative voltage. At this time, the memory cells of which the target state is the first program state may be verified by the first verify voltage PV1a. A second program voltage Vpgm_2 higher than the first program voltage Vpgm_1 by a step voltage Vstep_pgm is applied to the selected word line in the second program loop Loop_2. Thereafter, the first verify voltage PV1a corresponding to the first program state is applied.

A third program voltage Vpgm_3 higher than the second program voltage Vpgm_2 by the step voltage Vstep_pgm may be applied to the selected word line in the third program loop Loop_3. Thereafter, in order to verify the program state of the plurality of memory cells, an increased first verify voltage PV1b corresponding to the first program state and a second verify voltage PV2a corresponding to the second program state may be applied. At this time, both of the first verify voltage PV1b and the second verify voltage PV2a may be negative voltages. In addition, the first verify voltage PV1b applied in the third program loop Loop_3 may be higher than the first verify voltage PV1a applied in the first and second program loops Loop_1 and Loop_2 by a step voltage Vstep4_vfy. A magnitude of the step voltage Vstep4_vfy may be different according to the voltage level information stored in the voltage level storage 131.

A fourth program voltage Vpgm_4 higher than the third program voltage Vpgm_3 by the step voltage Vstep_pgm may be applied to the selected word line in the fourth program loop Loop_4. Thereafter, in order to verify the program state of the plurality of memory cells, the increased first verify voltage PV1b corresponding to the first program state and the second verify voltage PV2a corresponding to the second program state may be applied.

A fifth program voltage Vpgm_5 higher than the fourth program voltage Vpgm_4 by the step voltage Vstep_Pgm may be applied to the selected word line in the fifth program loop Loop5. Thereafter, in order to verify the program state of the plurality of memory cells, first to third verify voltages PV1c, PV2b, and PV3a respectively corresponding to the first and second program states may be applied. At this time, a magnitude of the first verify voltage PV1c corresponding to the first program state applied in the fifth program loop Loop_5 may be higher than the first verify voltage PV1b applied in the third and fourth program loops Loop_3 and Loop_4 by the step voltage Vstep4_vfy.

In addition, the magnitude of the second verify voltage PV2b applied after the first verify voltage PV1c is applied to the selected word line may be higher than the second verify voltage PV2a applied in the third and fourth program loops Loop_3 and Loop_4 by the step voltage Vstep4_vfy. At this time, the second verify voltage PV2b may increase from a negative voltage to a positive voltage. The magnitude of the step voltage Vstep4_vfy may be different according to the voltage level information stored in the voltage level storage 131 described with reference to FIG. 2.

A sixth program voltage Vpgm_6 higher than the fifth program voltage Vpgm_5 by the step voltage Vstep_pgm may be applied to the selected word line in the sixth program loop Loop_6. Thereafter, in order to verify the program state of the plurality of memory cells, an increased first verify voltage PV1c, the second verify voltage PV2b, and a third verify voltage PV3a corresponding to the third program state may be applied.

In an embodiment, the plurality of program loops Loop_1 to Loop_n may be performed identically to the first to sixth program loops Loop_1 to Loop_6 described above. At this time, as the plurality of program loops progress, the number of verify voltages corresponding to the number of target program states of the memory cells to be verified in the verify operation included in each program loop may increase. In addition, when the target program state of the memory cells to be verified in each program loop increases, the magnitude of the verify voltage respectively corresponding thereto may increase. The number of verify voltages included in each program loop and the magnitude of the verify voltage may be determined according to the voltage level information stored in the voltage level storage 131.

In another embodiment, during the verify operation included in each of the plurality of program loops Loop_Loopn, the verify voltages applied to the selected word line may be first applied to the selected word line as the voltage level of the verify voltages increases.

For convenience of description, a verify voltage corresponding to a new target program state is applied after repetition of two program loops among the plurality of program loops Loop_1 to Loop_n, but is not limited thereto.

In addition, as in the program method described with reference to FIG. 8, as the program loop is progressed, the verify voltages corresponding to the respective program states may be changed than the verify voltage in the previously performed program loop by a different step voltage Vstep4_vfy. For convenience of description, in FIG. 9, only the first and second verify voltages PV1a and PV2a corresponding to the first and second program states are negative voltages, but are not limited thereto.

FIG. 11 is a flowchart illustrating the program voltage application operation and the verify operation included in the program loop of the memory device of FIG. 1 according to an embodiment.

Referring to FIG. 11, in step S1101, the memory device may perform the program voltage application operation on the selected memory cells among the plurality of memory cells. The program voltage application operation may be an operation of applying the program voltage to the selected word line to which the selected memory cells are connected. In addition, the memory device may apply the program pass voltage to the unselected word line.

In step S1103, the memory device may apply some of the verify voltages corresponding to target program states of selected memory cells among the plurality of memory cells to the selected word line. At this time, the magnitude of the verify voltage applied to the selected word line may be determined according to the voltage level storage 131 described with reference to FIG. 2.

FIG. 12 is a flowchart illustrating the program voltage application operation and the verify operation using a changed verify voltage, which are included in the program loop of the memory device of FIG. 2, according to an embodiment.

Referring to FIG. 12, in step S1201, the memory device may perform the program voltage application operation on the selected memory cells among the plurality of memory cells. The program voltage application operation may be an operation of applying the program voltage to the selected word line to which the selected memory cells are connected.

Operations S1203 to S1209 illustrate the verify operations included in the program loop step by step. In step S1203, the control logic 130 included in the memory device of FIG. 2 may check the number of target program states of the memory cells corresponding to the verify voltages applied to the selected word line during the verify operation in the program loop. In step S1205, the control logic 130 may control the voltage generator 122 included in the memory device of FIG. 2 to generate the changed verify voltage according to the number of target program states checked in step S1203. In step S1205, the generated changed verify voltage is described in detail with reference to FIG. 13.

In step S1207, the control logic 130 may control the address decoder 121 described with reference to FIG. 2 to apply the verify voltage generated in step S1205 to the selected word line.

In step S1209, the sensing circuit 125 described with reference to FIG. 2 may generate the reference current based on the signal of the control logic 130. In addition, the sensing circuit 125 may output the pass signal or the fail signal to the control logic 130 by comparing the sensing voltage VPB received from the read and write circuit 123 with the reference voltage generated by the reference current.

Figure 13:
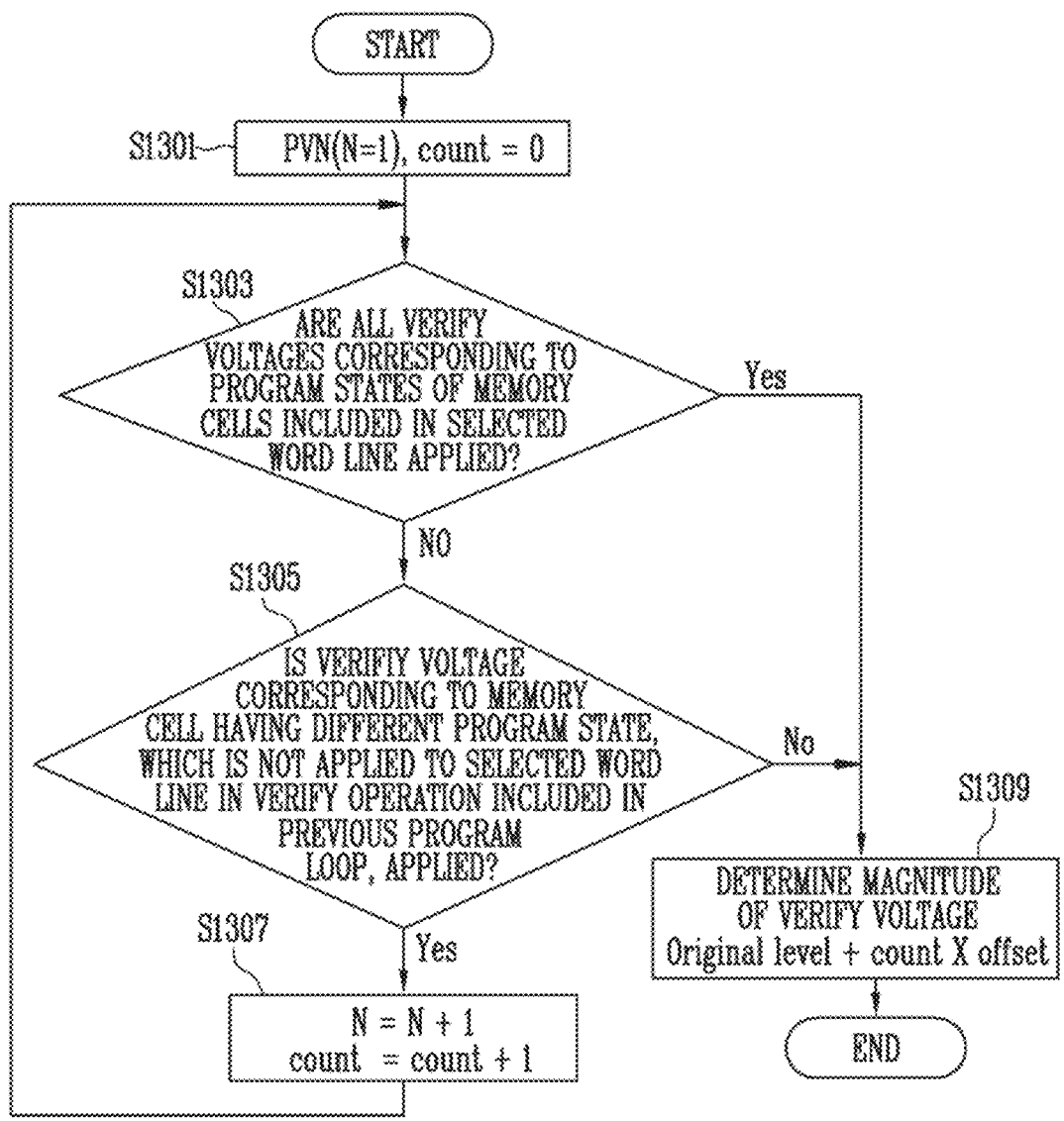
FIG. 13 is a flowchart illustrating an operation of generating the changed verify voltage during the program verify operation, according to an embodiment.

FIG. 13 is a flowchart illustrating an operation of generating the changed verify voltage during the program verify operation, according to an embodiment.

Referring to FIG. 13, in the program verify operation included in each of the plurality of program loops, the voltage generator 122 described with reference to FIG. 2 may generate the changed verify voltages corresponding to each of the memory cells according to a predetermined reference for each program loop, according to the signal from the control logic 130.

In step S1301, the control logic 130 described with reference to FIG. 2 may set an initial set value as PV1 and count=0.

In step S1303, during the verify operation included in the program loop, when all verify voltages corresponding to the target program states of the included memory cells are applied to the selected word line, step S1309 is progressed. At this time, the count value is not changed as the initial value of 0. Therefore, during the verify operation included in the previously performed program loop, the magnitude is determined as the magnitude of the verify voltages the same as the verify voltages applied to the selected word line. In step S1303, when all verify voltages corresponding to the target program states of the memory cells included in the selected word line are not applied, the method proceeds to step S1305.

In step S1305, in the verify operation included in the previous program loop, it is determined whether the verify voltage corresponding to the memory cell having a different program state that is not applied to the selected word line is applied. When the verify voltage corresponding to the memory cell having the different program state is not applied, the method proceeds to step S1309, and at this time, the count value is not changed as the initial value of 0. Therefore, during the verify operation included in the previously performed program loop, the magnitude is determined as the magnitude of the verify voltages the same as the verify voltages applied to the selected word line.

In step S1305, when the verify voltage corresponding to the memory cell having the different target program state is applied, the method proceeds to step S1307, an N value is increased to N+1, and the count value is also increased by 1.

After step S1307, step S1303 proceeds again, and steps S1303 and S1305 are identically performed. After step S1307, because the method is in the same program loop, the method may proceed from step S1305 to step S1309.

In step S1309, because the count value is increased, the magnitude of the verify voltage to be applied to the selected word line may increase by count X offset from the verify voltage corresponding to the existing target program state. At this time, the size of the offset may be set in advance. In addition, the size of the offset may be the same for all program loops, and may have different values for each program loop. In addition, the offset may be set differently according to the target program state corresponding to each verify voltage. The control logic 130 may control the peripheral circuit 120 to apply the verify voltage to the selected word line according to the magnitude of the verify voltage determined in step S1307. A limited example is described for convenience, but the present disclosure is not limited thereto.

Steps S1301 to S1309 may be repeatedly performed for each program loop.

Figures 14, 15:
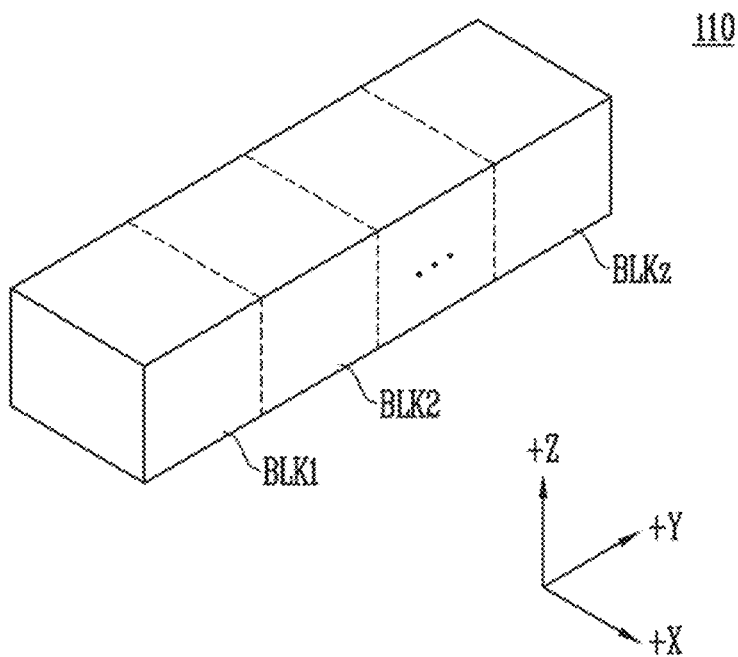
FIG. 14 is a diagram illustrating an offset according to a count value during the program verify operation.
FIG. 15 is a diagram illustrating an embodiment of the memory cell array of FIG. 2.

FIG. 14 is a diagram illustrating the offset according to the count value during the program verify operation.

Referring to FIG. 14, a table indicating the size of the offset according to the count value may be stored in the voltage level storage 131 described with reference to FIG. 2. The count value may correspond to each of the verify voltages applied to the selected word line in the verify operation included in the plurality of program loops Loop_1 to Loop_n described with reference to FIG. 5. In addition, the count value may be the number of program states higher than the target program state corresponding to the corresponding verify voltage among the target program states of the plurality of memory cells verified in the verify operation.

In an embodiment, the size of a reference offset may be different according to the count value. For example, when the count value is 1, the reference offset may be 10 mv.

When the count value is 2, the reference offset may be 15 mv. As the count value increases, the reference offset may also increase. Accordingly, as the program loop is progressed, the magnitudes of the verify voltages corresponding to the respective target program states may further increase. In addition, the reference offset according to all count values may be constant. In this case, as the count value increases, the magnitudes of the verify voltages corresponding to the respective target program states may increase constantly as the program loop is progressed. For convenience of description, a size value of the offset is described as an example, but an embodiment of the present disclosure is not limited thereto.

FIG. 15 is a diagram illustrating an embodiment of the memory cell array of FIG. 2.

Referring to FIG. 15, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction.

Figure 16:
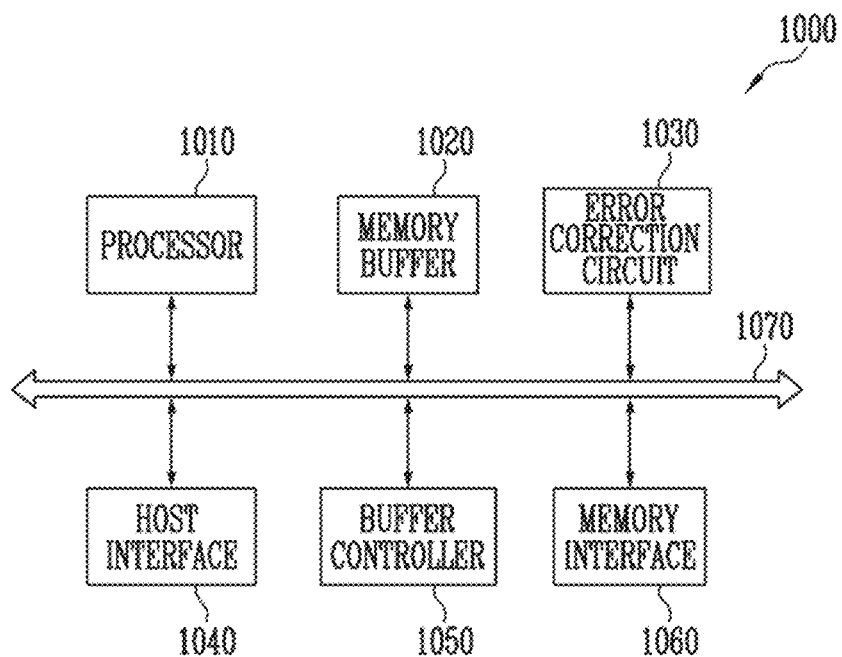
FIG. 16 is a diagram illustrating another embodiment of a memory controller of FIG. 1.

FIG. 16 is a diagram illustrating an embodiment of the memory controller of FIG. 1.

The memory controller 1000 is connected to a host Host and the memory device. The memory controller 1000 is configured to access the memory device in response to the request from the host Host. For example, the memory controller 1000 is configured to control the write, read, erase, and background operations of the memory device. The memory controller 1000 is configured to provide an interface between the memory device and the host Host. The memory controller 1000 is configured to drive firmware for controlling the memory device.

Referring to FIG. 16, the memory controller 1000 may include a processor 1010, a memory buffer 1020, an error correction circuit (ECC) 1030, a host interface 1040, a buffer controller (a buffer control circuit) 1050, a memory interface 1060, and a bus 1070.

The bus 1070 may be configured to provide a channel between components of the memory controller 1000.

The processor 1010 may control an overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 may convert a logical block address (LBA) provided by the host into a physical block address (PBA) through the FTL. The FTL may receive the LBA using a mapping table and convert the LBA into the PBA. An address mapping method of the FTL includes several address mapping methods according to a mapping unit. Representative address mapping methods include a page mapping method, a block mapping method, and a hybrid mapping method.

The processor 1010 is configured to randomize data received from the host Host. For example, the processor 1010 may randomize the data received from the host Host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The ECC 1030 may perform error correction. The ECC 1030 may perform error correction encoding (ECC encoding) based on data to be written to the memory device through memory interface 1060. The error correction encoded data may be transferred to the memory device through the memory interface 1060. The ECC 1030 may perform error correction decoding (ECC decoding) on the data received from the memory device through the memory interface 1060. For example, the ECC 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection express (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the ECC 1030, and the memory interface 1060. The control bus may be connected to the host interface 1040, the processor 1010, the buffer controller 1050, the memory buffer 1202, and the memory interface 1060.

Figure 17:
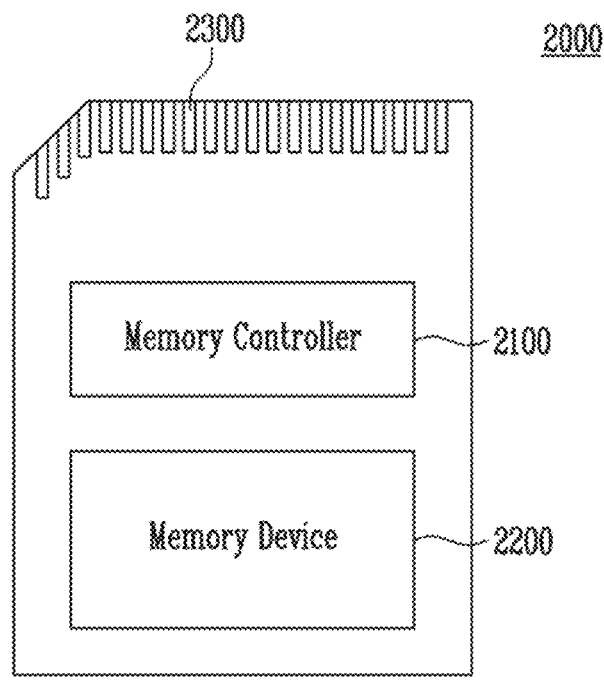
FIG. 17 is a block diagram illustrating a memory card system to which the storage device according to an embodiment of the present disclosure is applied.

FIG. 17 is a block diagram illustrating a memory card system to which the storage device according to an embodiment of the present disclosure is applied.

Referring to FIG. 17, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

For example, the memory controller 2100 may include components such as random access memory (RAM), a processor, a host interface, a memory interface, and an ECC.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. For example, the connector 2300 may be defined by at least one of the various communication standards described above.

For example, the memory device 2200 may be configured to include various types of non-volatile memory, such as electrically erasable and programmable ROM (EEPROM), NAND flash memory, NOR flash memory, phase-change RAM (PRAM), resistive RAM (ReRAM), ferroelectric RAM (FRAM), and spin-transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash (CF) card, a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 18:
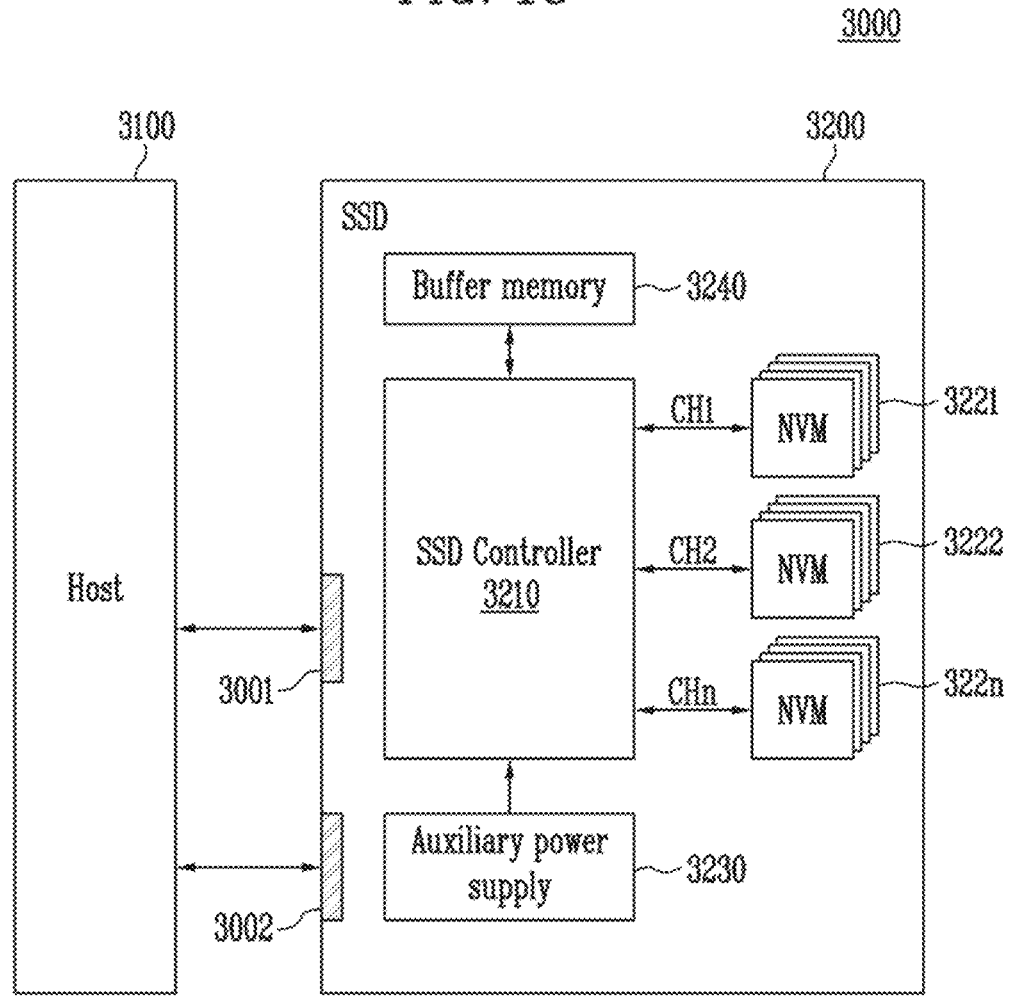
FIG. 18 is a block diagram illustrating a solid state drive (SSD) system to which the storage device according to an embodiment of the present disclosure is applied.

FIG. 18 is a block diagram illustrating a solid state drive (SSD) system to which the storage device according to an embodiment of the present disclosure is applied.

Referring to FIG. 18, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include volatile memory, such as DRAM, SDRAM, DDR SDRAM, LPDDR SDRAM, and GRAM, or non-volatile memory, such as FRAM, ReRAM, STT-MRAM, and PRAM.

Figure 19:
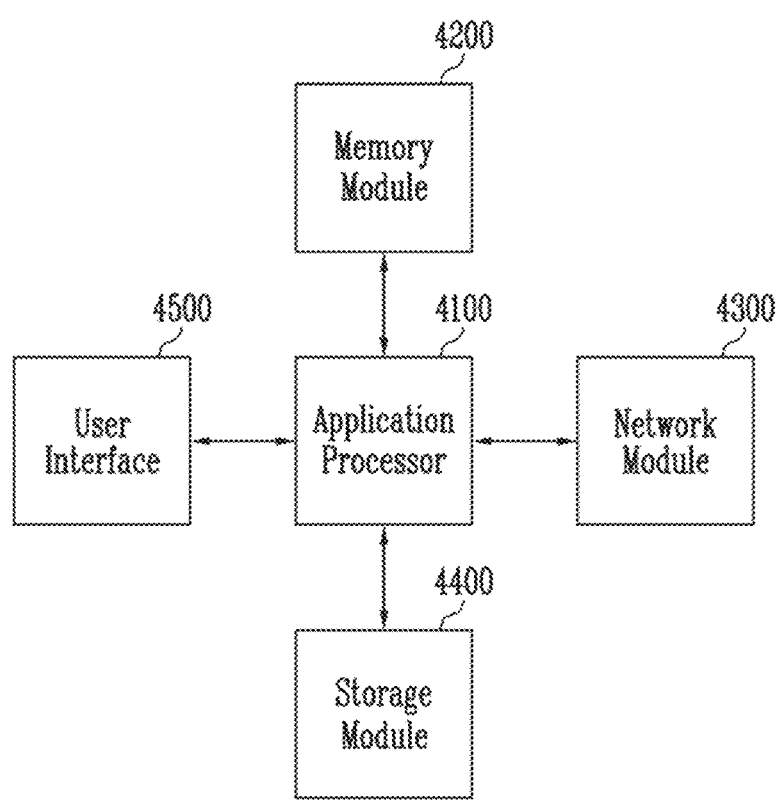
FIG. 19 is a block diagram illustrating a user system to which the storage device according to an embodiment of the present disclosure is applied.

FIG. 19 is a block diagram illustrating a user system to which the storage device according to an embodiment of the present disclosure is applied.

Referring to FIG. 19, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include volatile random access memory, such as DRAM, SDRAM, DDR SDRAM, DDR2 SDRAM, DDR3 SDRAM, LPDDR SDARM, LPDDR2 SDRAM, and LPDDR3 SDRAM, or a non-volatile random access memory, such as PRAM, ReRAM, MRAM, and FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented using non-volatile semiconductor memory, such as phase-change RAM (PRAM), magnetic RAM (MRAM), resistive RAM (RRAM), NAND flash, NOR flash, and three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
   a plurality of memory cells;
   a peripheral circuit configured to perform a program operation including a plurality of program loops, wherein each of the plurality of program loops includes an operation to sequentially apply a program voltage and at least one verify voltage from among a plurality of verify voltages to a selected word line commonly connected to the plurality of memory cells; and
   control logic configured to, based on a number of verify voltages with a higher level than a selected verify voltage, from among verify voltages of an operation that is included in a selected program loop from among the plurality of program loops, increase a level of the selected verify voltage.

2. The memory device of claim 1, wherein the control logic is configured to control the peripheral circuit to:
   sequentially apply the program voltage and the verify voltages to the selected word line during an N-th (N is a natural number equal to or greater than 1) program loop that is the selected program loop; and
   sequentially apply the program voltage and (N+1)-th loop verify voltages, that include the selected verify voltage with an increased level by a level of a step voltage, to the selected word line during an (N+1)-th program loop among the plurality of program loops.

3. The memory device of claim 2, wherein the level of the step voltage is determined according to an offset value and the number of verify voltages with the higher level than the selected verify voltage.

4. The memory device of claim 2, wherein the (N+1)-th loop verify voltages comprise at least one of N-th loop verify voltages.

5. The memory device of claim 2, wherein the level of the step voltage is determined according to target program states corresponding to the respective (N+1)-th loop verify voltages.

6. The memory device of claim 5, wherein the step voltage has a higher level as threshold voltages respectively corresponding to the target program states of memory cells increase.

7. The memory device of claim 5, wherein the step voltage has a higher level as threshold voltages respectively corresponding to the target program states corresponding to the respective (N+1)-th loop verify voltages decrease.

8. The memory device of claim 5, wherein N-th loop verify voltages comprise at least one verify voltage with a negative level and at least one verify voltage with a positive level.

9. The memory device of claim 5, wherein the (N+1)-th loop verify voltages are first applied to the selected word line as a level of the (N+1)-th loop verify voltages increases during a verify operation included in the (N+1)-th program loop.

10. A memory device comprising:
    a memory cell array including a plurality of memory cells connected to a plurality of word lines;
    a peripheral circuit configured to perform a program operation including a plurality of program loops each including an operation to apply a program voltage to a selected word line among the plurality of word lines and a verify operation to apply at least one verify voltage among a plurality of verify voltages; and
    control logic configured to:
    based on a number of verify voltages with a higher level than a selected verify voltage, from among at least two verify voltages of a verify operation that is included in a selected program loop from among the plurality of program loops, increase a level of the selected verify voltage, and
    control the peripheral circuit to perform the program operation using the selected verify voltage with an increased level.

11. The memory device of claim 10, wherein the control logic is configured to control the peripheral circuit to:
    apply the at least two verify voltages to the selected word line during a verify operation included in an N-th program loop among the plurality of program loops, and
    apply (N+1)-th loop verify voltages, that include the selected verify voltage with an increased level by a level of a step voltage, to the selected word line during a verify operation included in an (N+1)-th program loop.

12. The memory device of claim 11, wherein the level of the step voltage is determined based on an offset value and the number of verify voltages with the higher level than the selected verify voltage.

13. The memory device of claim 11, wherein the control logic comprises:
    a counter configured to count a number of times that each of the plurality of verify voltages is applied to the selected word line; and
    a step voltage storage configured to store level information of a step voltage corresponding to a value of the counter, and
    wherein the control logic is configured to determine the step voltage according to the level information stored in the step voltage storage and the value of the counter in the verify operation included in the (N+1)-th program loop.

14. A method of operating a memory device that performs a program operation of storing data in a plurality of memory cells, the program operation including a plurality of program loops each including a program voltage application operation and a verify operation, the method comprising:
applying a program voltage to a word line commonly connected to the plurality of memory cells; and
applying, in the verify operation, verify voltages which are respectively increased by step voltages from verify voltages applied in a verify operation of a previous program loop, to the word line,
wherein each of the step voltages is determined based on a number of verify voltages with a higher level than a selected verify voltage corresponding to the each of the step voltages from among the verify voltages of the verify operation.

15. The method of claim 14, wherein the applying the verify voltages comprises generating the verify voltages which are respectively increased by the step voltages.

16. The method of claim 14, wherein the verify voltages comprise at least one verify voltage with a positive level and at least one verify voltage with a negative value.

17. The method of claim 14, wherein the each of the step voltages is determined based on the number of verify voltages with the higher level and an offset value.

18. A memory device comprising:
a plurality of memory cells;
a peripheral circuit configured to perform a program operation of storing data in the plurality of memory cells, wherein the program operation includes a plurality of program loops each including an operation to apply a program voltage to a selected word line commonly connected to the plurality of memory cells and a verify operation to apply at least one verify voltage among verify voltages respectively corresponding to target program states of the plurality of memory cells; and
control logic configured to:
based on a number of verify voltages with a higher level than a selected verify voltage from among at least two verify voltages of a verify operation that is included in a selected program loop from among the plurality of program loops, increase a level of the selected verify voltage, and
control the peripheral circuit to perform the program operation using the selected verify voltage with an increased level,
wherein the at least two verify voltages comprise at least one verify voltage with a negative level and at least one verify voltage with a positive level.

* * * * *